US012745530B2

(12) United States Patent
Liu et al.

(10) Patent No.: US 12,745,530 B2
(45) Date of Patent: Sep. 22, 2026

(54) PIXEL ARRANGEMENT STRUCTURES, DISPLAY PANELS, AND DISPLAY DEVICES

(71) Applicant: KUNSHAN GO-VISIONOX OPTO-ELECTRONICS CO., LTD., Kunshan (CN)

(72) Inventors: Mingxing Liu, Kunshan (CN); Yu Wang, Kunshan (CN); Tian Ma, Kunshan (CN); Dong Zhao, Kunshan (CN); Jing Shao, Kunshan (CN); Yang Shao, Kunshan (CN); Chao Chi Peng, Kunshan (CN); Junfeng Li, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 645 days.

(21) Appl. No.: 17/982,253

(22) Filed: Nov. 7, 2022

(65) Prior Publication Data

US 2023/0058293 A1 Feb. 23, 2023

Related U.S. Application Data

(63) Continuation of application No. PCT/CN2021/089606, filed on Apr. 25, 2021.

(30) Foreign Application Priority Data

Jul. 1, 2020 (CN) ......................... 202010622095.6
Jul. 1, 2020 (CN) ......................... 202010622109.4
Jul. 1, 2020 (CN) ......................... 202010622110.7

(51) Int. Cl.
*H10K 59/35* (2023.01)
*H10K 59/80* (2023.01)

(52) U.S. Cl.
CPC ......... *H10K 59/353* (2023.02); *H10K 59/351* (2023.02); *H10K 59/352* (2023.02); *H10K 59/876* (2023.02)

(58) Field of Classification Search
CPC .. H10K 59/353; H10K 59/351; H10K 59/352; H10K 59/876; G09G 3/20; G09G 5/04
See application file for complete search history.

(56) References Cited

U.S. PATENT DOCUMENTS 12,329,010 B1 6/2025 Liu
2014/0055330 A1 2/2014 Park et al.
(Continued)

FOREIGN PATENT DOCUMENTS

CN 106653799 A 5/2017
CN 106935612 A 7/2017
(Continued)

OTHER PUBLICATIONS

Extended European Search Report (EP Application No. 21833145.2) , dated May 25, 2023, 9 pages.
(Continued)

*Primary Examiner* — Fernando L Toledo
*Assistant Examiner* — Marshall Mu-Nuo Hatfield
(74) *Attorney, Agent, or Firm* — Quarles & Brady LLP

(57) ABSTRACT

The present application relates to a pixel arrangement structure, including a first pixel unit. The first pixel unit includes a first sub-pixel, a second sub-pixel, a third sub-pixel, and a fourth sub-pixel, and centers of the first sub-pixel, the second sub-pixel, the third sub-pixel and the fourth sub-pixel forms imagined co-sided triangles without an overlapping area; and the center of the first sub-pixel and the center of the second sub-pixel are taken as vertices of a common side of the imagined co-sided triangle. The second sub-pixel has a second major axis and a second minor axis, and in the
(Continued)

first pixel unit, a center line of the second sub-pixel along its major axis does not pass through the center of the third sub-pixel and/or the center of the fourth sub-pixel.

18 Claims, 8 Drawing Sheets

(56) References Cited

U.S. PATENT DOCUMENTS

| | | | | |
|---|---|---|---|---|
| 2015/0015465 | A1 | 1/2015 | Gong | |
| 2016/0078807 | A1 | 3/2016 | Sun | |
| 2017/0133449 | A1 | 5/2017 | Kim et al. | |
| 2017/0263691 | A1 | 9/2017 | Seo et al. | |
| 2018/0308907 | A1 | 10/2018 | Jin et al. | |
| 2019/0252469 | A1 | 8/2019 | Xiao et al. | |
| 2019/0326366 | A1 | 10/2019 | Fan et al. | |
| 2020/0058713 | A1* | 2/2020 | Zhang | H10K 59/353 |
| 2020/0075687 | A1 | 3/2020 | He et al. | |
| 2020/0142265 | A1* | 5/2020 | Zhao | G02F 1/134336 |
| 2020/0342797 | A1* | 10/2020 | Zhai | G02F 1/29 |
| 2021/0175299 | A1* | 6/2021 | Lee | H10K 59/353 |
| 2021/0193766 | A1 | 6/2021 | Liu | |
| 2021/0408140 | A1* | 12/2021 | Han | H10K 50/822 |
| 2021/0408161 | A1* | 12/2021 | Sui | H10K 59/352 |
| 2022/0005881 | A1 | 1/2022 | Ma et al. | |
| 2022/0123074 | A1 | 4/2022 | Zhang | |
| 2022/0208891 | A1 | 6/2022 | Liu et al. | |

FOREIGN PATENT DOCUMENTS

| | | | |
|---|---|---|---|
| CN | 106960863 | A | 7/2017 |
| CN | 207966985 | U | 10/2018 |
| CN | 207966994 | U | 10/2018 |
| CN | 109148543 | A | 1/2019 |
| CN | 109524449 | A | 3/2019 |
| CN | 110137210 | A | 8/2019 |
| CN | 110444569 | A | 11/2019 |
| CN | 110518036 | A | 11/2019 |
| CN | 210073853 | U | 2/2020 |
| CN | 111341817 | A | 6/2020 |
| CN | 112436029 | A | 3/2021 |
| CN | 112436030 | A | 3/2021 |
| CN | 112436031 | A | 3/2021 |
| KR | 101427593 | B1 | 8/2014 |
| KR | 20170106088 | A | 9/2017 |
| KR | 10-2018-0024987 | A | 3/2018 |
| KR | 20190117720 | A | 10/2019 |
| KR | 1020200055177 | A | 5/2022 |

OTHER PUBLICATIONS

Extended European Search Report (EP Application No. 23152335.8) , dated May 26, 2023, 11 pages.
Extended European Search Report (EP Application No. 23152340.8 , dated Jun. 9, 2023, 9 pages.
Office Action, Japanese Patent Application No. 2023-012444, Jan. 11, 2024, with English translation.
Office Action, Japanese Patent Application No. 2023-012443, Jan. 11, 2024, with English translation.
Office Action, Japanese Patent Application No. 2022-580483, Jan. 11, 2024, with English translation.
International Search Report and Written Opinion (International Application No. PCT/CN2021/089606) with English Translation, dated Jul. 15, 2021, 14 pages.
Chinese Search Result (CN Application No. 202010622095.6) with English Translation, dated Aug. 31, 2022, 4 pages.
Chinese Search Result (CN Application No. 202010622109.4) with English Translation, dated Sep. 5, 2022, 4 pages.
Chinese Search Result (CN Application No. 202010622110.7) with English Translation, dated Sep. 7, 2022, 4 pages.
Taiwan First Office Action (TW Application No. 110116643) and Search Result with English Translation, dated May 30, 2022, 10 pages.
Office Action for European Application No. 23152335.8 dated Jun. 24, 2025; 7 pages.
Office Action for Application No. KR1020237002010 dated May 11, 2025; 8 pages.
Office Action for Application No. KR1020237002013, dated May 11, 2025; 8 pages.
Extended European Search Report, dated Jan. 28, 2026, 9 pages.
Office Action for KR 10-2023-7002010, dated Oct. 29, 2025, 7 pages.
Notice of Allowance for KR Application No. 10-2023-7000098, mailed Oct. 14, 2025, 4 pages.

* cited by examiner

PIXEL ARRANGEMENT STRUCTURES, DISPLAY PANELS, AND DISPLAY DEVICES

CROSS-REFERENCES TO RELATED APPLICATIONS

This application is a continue application to International Application PCT/CN2021/089606, filed on Apr. 25, 2021, which claims priority to Chinese Patent Application No. 2020106221094, entitled "PIXEL ARRANGEMENT STRUCTURE, DISPLAY PANEL, AND DISPLAY DEVICE" and filed with the Chinese Patent Office on Jul. 1, 2020, Chinese Patent Application No. 2020106221107, entitled "PIXEL ARRANGEMENT STRUCTURE, DISPLAY PANEL, AND DISPLAY DEVICE" and filed with the Chinese Patent Office on Jul. 1, 2020, and Chinese Patent Application No. 2020106220956, entitled "PIXEL ARRANGEMENT STRUCTURE, DISPLAY PANEL, AND DISPLAY DEVICE" and filed with the Chinese Patent Office on Jul. 1, 2020. The entire contents of the above applications are incorporated herein by reference.

TECHNICAL FIELD

The present application relates to the field of display technologies.

BACKGROUND

With continuous development of a display technology, people have higher and higher requirements for resolution of display panels. Due to advantages such as high quality of display, high-resolution display panels are more and more widely used. Generally, resolution of a display device may be improved by reducing sizes of sub-pixels and pitches between sub-pixels.

SUMMARY

Based on the above, there is a need to provide a pixel arrangement structure, a display panel, and a display device, which can effectively ameliorate a color edge phenomenon and improve a display effect while realizing high resolution.

According to a first aspect of the present application, a pixel arrangement structure is provided, including a plurality of first pixel units and a plurality of second pixel units, the plurality of first pixel units and the plurality of second pixel units are alternately arranged in a first direction and a second direction;

each of the first pixel units and the second pixel units including a first sub-pixel, a second sub-pixel, a third sub-pixel, and a fourth sub-pixel; in each of the first pixel units and the second pixel units, the first sub-pixel is located at one side of a connecting line between a center of the third sub-pixel and a center of the fourth sub-pixel, and the second sub-pixel is located at another side of the connecting line between a center of the third sub-pixel and a center of the fourth sub-pixel;

after the second pixel units are rotated by a predetermined angle, sub-pixel arrangement structures thereof are mirror-symmetrical to sub-pixel arrangement structures of the first pixel units; and the predetermined angle is greater than 0° and less than 3600.

In the above pixel arrangement structure, after the second pixel units are rotated by a predetermined angle, the sub-pixel arrangement structures thereof are mirror-symmetrical to the sub-pixel arrangement structures of the first pixel units, so that arrangement compactness of sub-pixels and pitches between the sub-pixels may be taken into account to seek a balance therebetween, which is conducive to reducing a color mixing risk and ameliorating a color edge and a sense of visual granularity while having high resolution.

According to a second aspect of the present application, a pixel arrangement structure is provided, including a first pixel unit; the first pixel unit including a first sub-pixel, a second sub-pixel, a third sub-pixel, and a fourth sub-pixel; in the first pixel unit, the second sub-pixel, the third sub-pixel and the fourth sub-pixel forming imagined co-sided triangles without an overlapping area are formed with centers of the first sub-pixel; and the center of the first sub-pixel and the center of the second sub-pixel are taken as vertices of a common side of the imagined co-sided triangle;

the second sub-pixel has a second major axis and a second minor axis, and in the first pixel unit, a center line of the second sub-pixel along the second major axis of the second sub-pixel does not pass through the center of the third sub-pixel or the center of the fourth sub-pixel.

According to a third aspect of the present application, a pixel arrangement structure is provided, including first sub-pixels, second sub-pixels, third sub-pixels, and fourth sub-pixels; centers of two of the first sub-pixels arranged opposite to each other and centers of two of the second sub-pixels arranged opposite to each other are taken as vertices and connected to form a virtual quadrilateral, the virtual quadrilateral including two equal sides arranged opposite to each other, a short side and a long side arranged opposite to each other and connected to vertices of the equal sides; the short side of the virtual quadrilateral is not parallel to the long side of the virtual quadrilateral; and one of the third sub-pixels or one of the fourth sub-pixels are arranged in the virtual quadrilateral, and the third sub-pixel and the fourth sub-pixel emitting light in a same color.

According to a fourth aspect of the present application, a display panel is provided, including the pixel arrangement structure according to any one of the embodiments in the first to third aspects of the present application.

According to a fifth aspect of the present application, a display device is provided, including the display panel according to the embodiment in the fourth aspect of the present application.

DETAILED DESCRIPTION OF THE EMBODIMENTS

Figure 1:
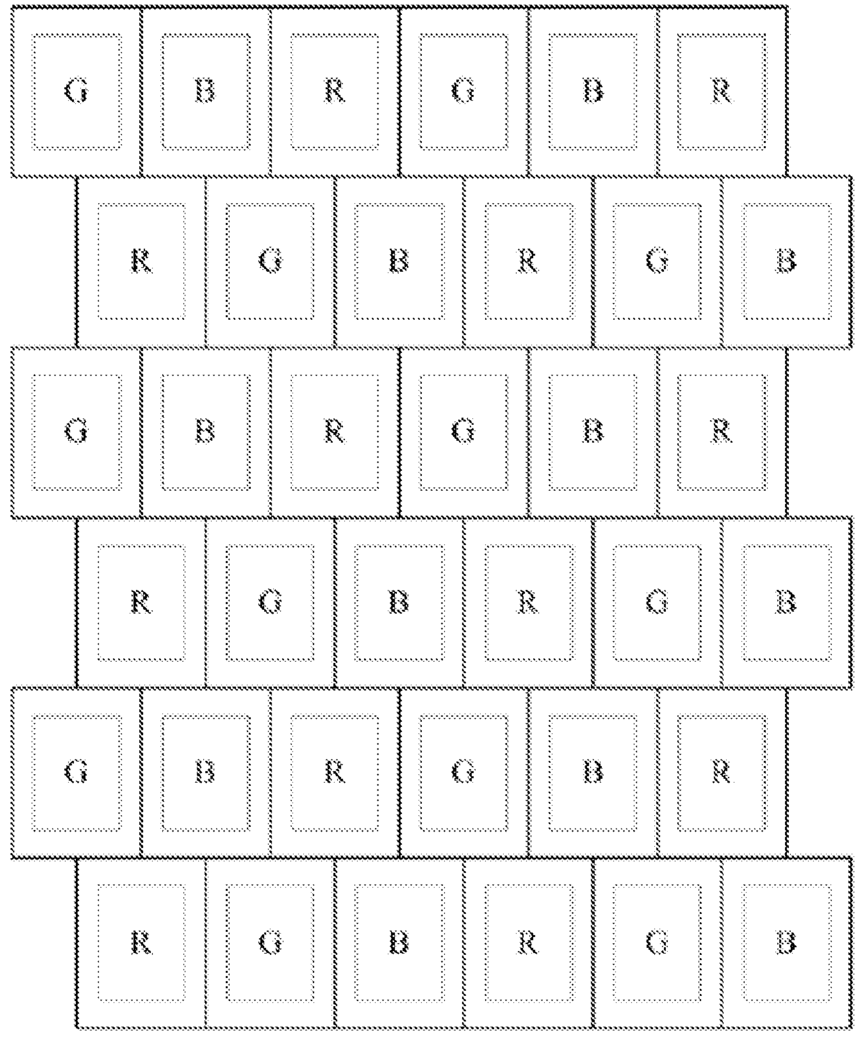
FIG. 1 is a schematic diagram of pixel arrangement.

To facilitate understanding of the present application, a more comprehensive description of the present application will be given below with reference to the relevant accompanying drawings. Preferred embodiments of the present application are given in the drawings. However, the present application may be implemented in many different forms and is not limited to the embodiments described herein. Rather, these embodiments are provided to make the contents disclosed in the present application more fully understood.

It is to be understood that, although the terms such as "first" and "second" may be used herein to describe various elements, they do not indicate any order, quantity, or importance but merely distinguish different components. These terms are used only to distinguish one element from another element. For example, without departing from the scope of the present application, the first element may be referred to as the second element, and similarly, the second element may be referred to as the first element. "Comprise" or "include" and other similar words mean that an element or thing appearing before the word covers elements or things listed after the word and equivalents thereof, without excluding other elements or things.

The reduction in the sizes of the sub-pixels and the pitches between the sub-pixels is often accompanied with higher and higher requirements on accuracy of a manufacturing process, leading to an increase in difficulty of the manufacturing process and manufacturing costs of the display device.

An organic light-emitting diode (OLED) display panel is current-driven, and a pixel driving circuit is required to connect an OLED device to provide a driving current for the OLED device to emit light. The OLED device includes at least an anode, a cathode, and an organic light-emitting material located between the anode and cathode. For example, in a top-emission type OLED display panel, the organic light-emitting material, due to poor stability, cannot be patterned through a conventional etching process, and thus a vapor deposition process with a mask is used instead. The organic light-emitting material is placed in a vacuum environment, and is evaporated or sublimated by heating. A mask is arranged between a cavity for evaporating the organic material and a to-be-vapor-deposited array substrate. The mask is provided with openings corresponding to regions requiring vapor deposition, while regions not requiring vapor deposition have no openings. The evaporated or sublimated organic material molecules are attached to the to-be-vapor-deposited array substrate through the openings, thereby directly forming a patterned organic material layer. The mask configured to correspondingly vapor-deposit light-emitting material layers of sub-pixels is a fine metal mask (FMM), also called a fine mask. Due to limitations in sizes of the openings of the fine mask, sizes of distances between the openings, and net-tension difficulties, it is difficult to further improve pixel per inch (referred as PPI hereinafter) of the organic light-emitting display panel with the pixel arrangement in the prior art.

In order to solve the above problem, in the related art, the resolution of the display panel may be improved by using a Sup-Pixel Rendering (SPR) technology. The SPR technology may make use of differences of human eyes) resolution to sub-pixels in different colors to change a conventional mode of defining a pixel simply by red, green and blue sub-pixels, and simulate and realize a performance capability of a same pixel resolution by using a relatively small number of sub-pixels by sharing certain sub-pixels in colors insensitive to position resolution between different pixels, so as to reduce the difficulty in the manufacturing process and decrease the manufacturing costs. As shown in FIG. 1, a non-rendered pixel includes three sub-pixels, while a rendered pixel includes only two sub-pixels. Therefore, the number of pixels can be increased by 50% while the sub-pixels remain unchanged, thereby improving the resolution. However, in the SPR technology, each pixel includes only two sub-pixels, which, in order to achieve full color display, is required to borrow colors that cannot be displayed from neighboring sub-pixels. Therefore, in the case of display is performed by this pixel arrangement structure, a color edge may appear at an edge of a screen due to differences in numbers of sub-pixels in various colors in a row direction and/or a column direction, or different protrusion degrees of sub-pixels at display edges, thereby affecting the quality of display.

At the same time, to enable the display panel to have a better light-emitting effect, the arrangement of the sub-pixels is expected to be more uniform, and adjacent pixels in a same color are designed to share a mask opening, so as to increase an opening area of the mask and reduce the difficulty of alignment. However, in the case of display by the display panel with this pixel arrangement structure, it may be difficult for human eyes to distinguish the adjacent pixels in the same color, which results in visual integration of the two pixels in the same color, thereby producing a sense of granularity and affecting the quality of display.

In addition, to enable a terminal device to implement more functions, it is also more and more extensive to arrange a photosensitive device in an under-screen display region. For example, a fingerprint recognition device is arranged in the under-screen display region. The fingerprint recognition device includes a photosensitive device configured to acquire a fingerprint image. The photosensitive device may include an optical sensor. The optical sensor may include a plurality of pixel points. The plurality of pixel points may respectively receive light signals reflected from different positions of an object and convert the received light signals into electrical signals, so as to generate an image of the object. Therefore, an amount of light input and contrast of the light signals received by the pixel points may both affect the quality of the generated image of the object. In this way, certain requirements are also put forward for light transmittance of the display panel, which further increases the difficulty in the design of the pixel arrangement structure.

In order to solve at least one of the above problems, the present application provides a pixel arrangement structure, a display panel and a display device, which can better alleviate the above problems.

Figure 2:
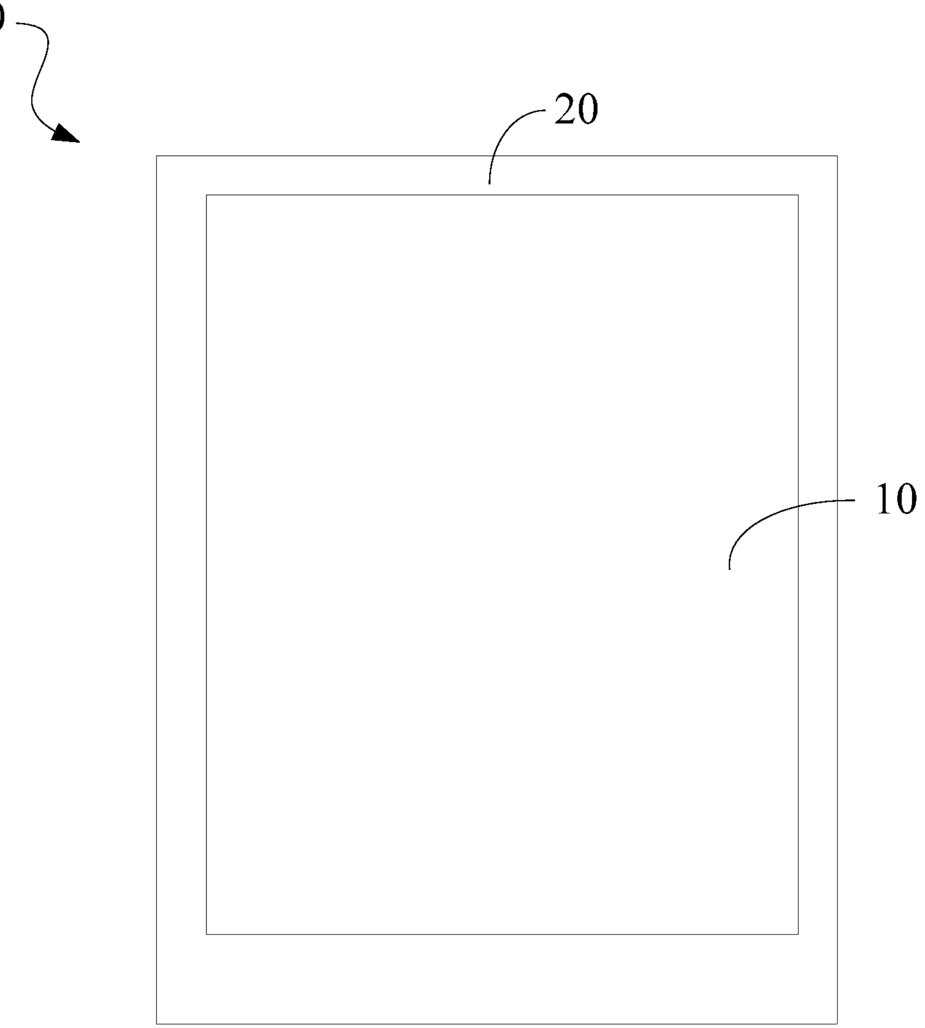
FIG. 2 is a structural schematic diagram of a display panel according to an embodiment of the present application.

FIG. 2 is a structural schematic diagram of a display panel according to an embodiment of the present application.

Referring to the drawing, a display panel 100 according to at least one embodiment of the present application includes a display region 10 and a non-display region 20. The display region 10 displays an image through a plurality of sub-pixels. Specifically, the display region 10 may be in the shape of a rectangle, and the non-display region 20 is arranged around the display region 10. Certainly, shapes and arrangement of the display region 10 and the non-display region 20 include, but are not limited to, the above example. For example, when the display panel 100 is configured for a wearable device (such as a watch) worn on a user, the display region 10 may have a circular shape like a watch. When a display substrate is configured for display on a vehicle, the display region 10 and the non-display region 20 may take a shape of a circle, a polygon, or other shapes. The display region 10 is provided with a plurality of sub-pixels that emit light in different colors. The sub-pixels mean minimum units configured to emit light (for example, a minimum addressable unit of the display panel 100).

Figure 3:
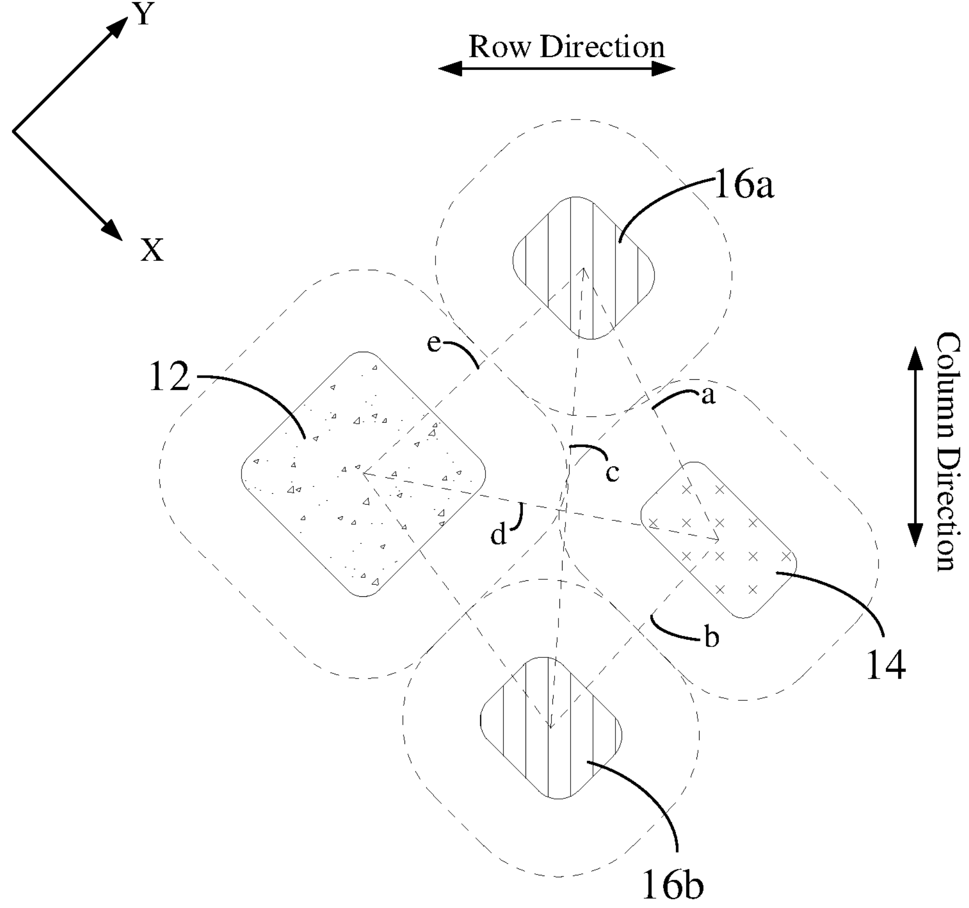
FIG. 3 is a schematic diagram of arrangement of first pixel units according to an embodiment of the present application.
Figure 4:
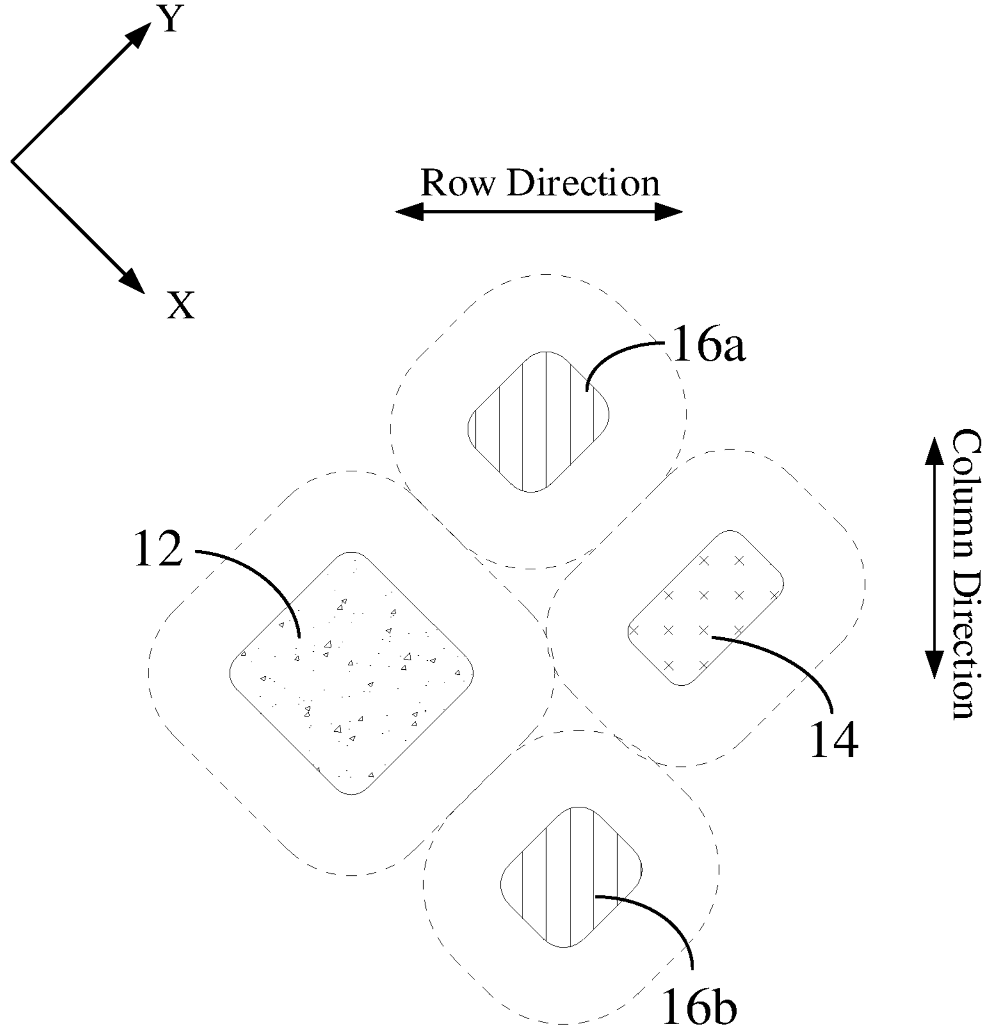
FIG. 4 is a schematic diagram of arrangement of second pixel units according to an embodiment of the present application.
Figure 5:
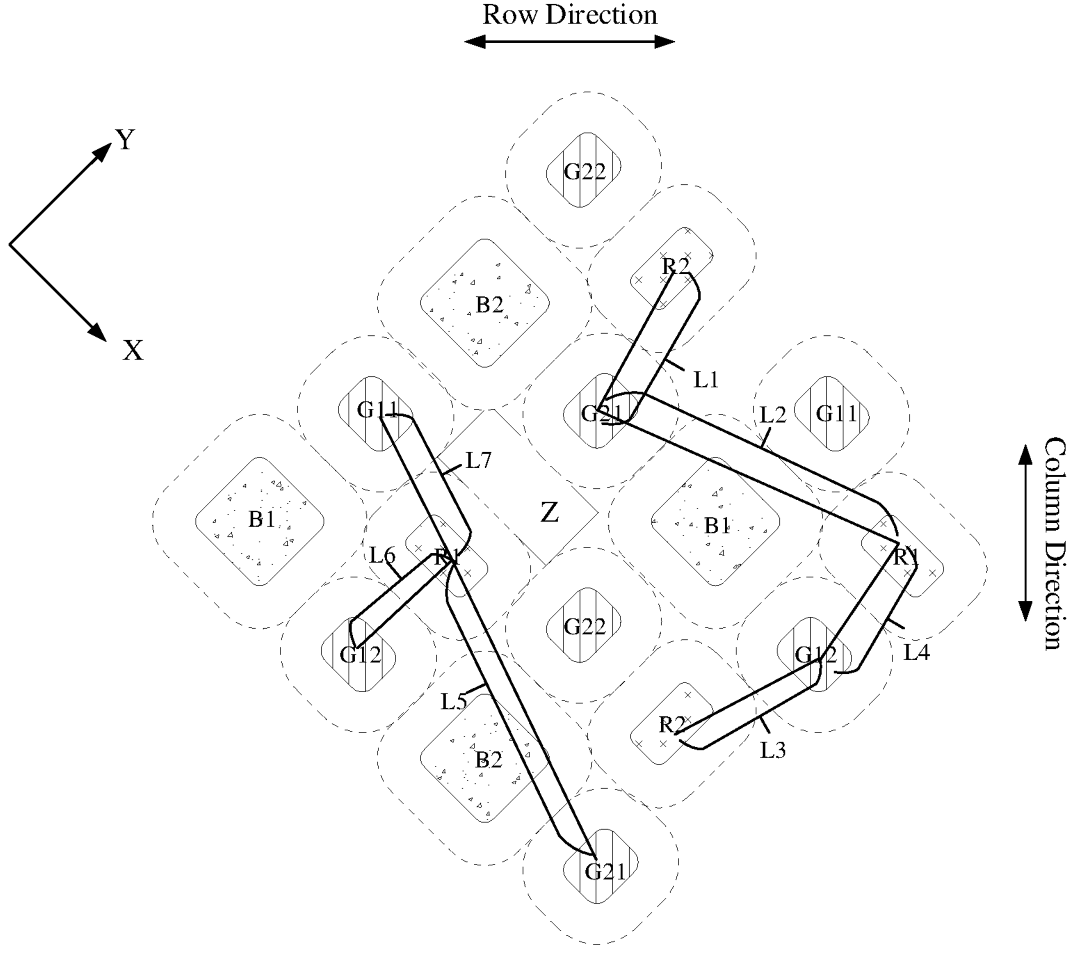
FIG. 5 is a schematic diagram of arrangement of repetitive units according to an embodiment of the present application.
Figure 6:
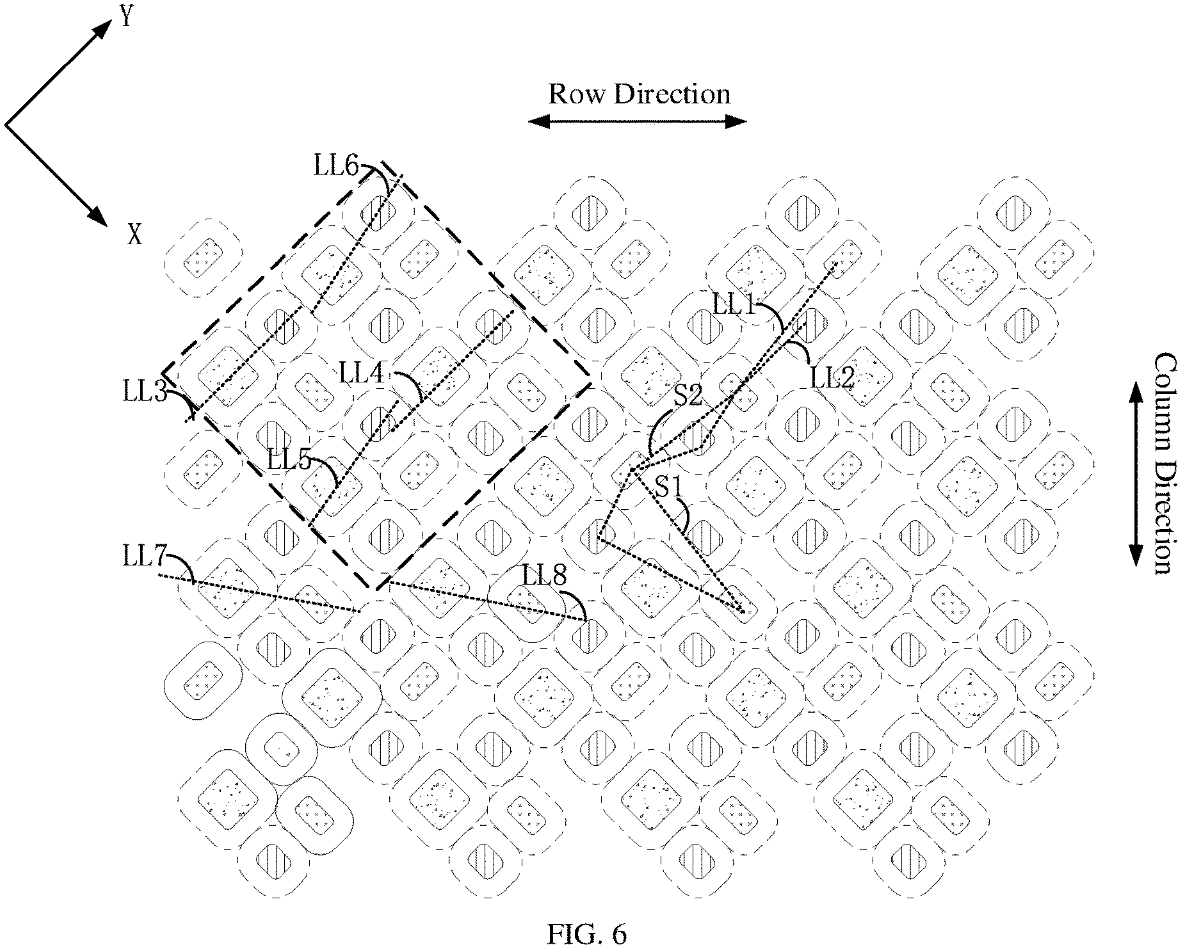
FIG. 6 is a schematic diagram of arrangement of a display matrix according to an embodiment of the present application.
Figure 7:
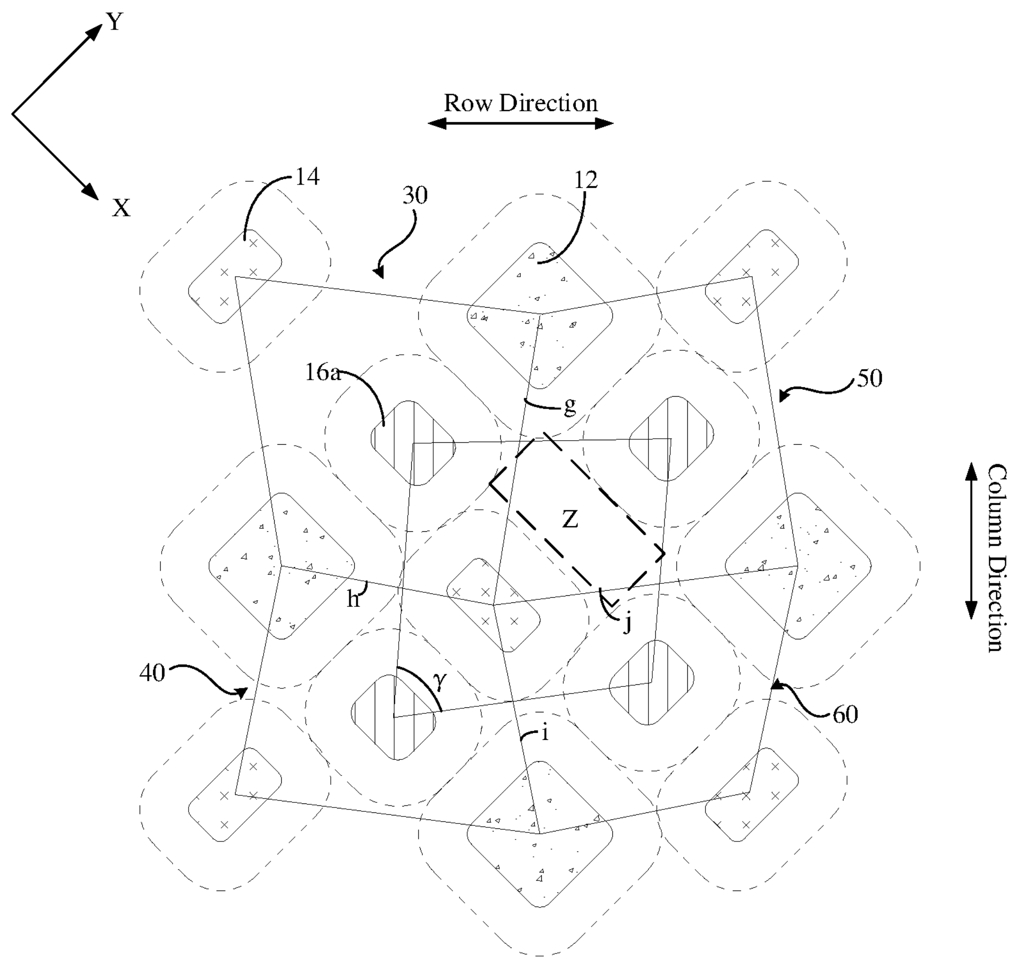
FIG. 7 is a schematic diagram of a partial structure of a pixel arrangement structure according to an embodiment of the present application.

FIG. 3 is a schematic diagram of arrangement of first pixel units according to an embodiment of the present application. FIG. 4 is a schematic diagram of arrangement of second pixel units according to an embodiment of the present application. FIG. 5 is a schematic diagram of arrangement of repetitive units according to an embodiment of the present application. FIG. 6 is a schematic diagram of arrangement of a display matrix according to an embodiment of the present application. FIG. 7 is a schematic diagram of a partial structure of a pixel arrangement structure according to an embodiment of the present application.

Specifically referring to FIG. 3 to FIG. 7, a pixel arrangement structure is provided in a first aspect of the present application.

According to the first aspect of the present application, the pixel arrangement structure according to at least one embodiment of the present application includes a plurality of first pixel units and a plurality of second pixel units. The first pixel units and the second pixel units are adjacent to each other, and the plurality of first pixel units and the plurality of second pixel units are alternately arranged in a first direction and a second direction. For example, as shown in FIG. 5 and FIG. 6, the first direction is the X direction in the figures, and the second direction is the Y direction in the figures. In the first direction, the first pixel units and the second pixel units are alternately arranged. In the second direction, the first pixel units and the second pixel units are alternately arranged. That is, in the first direction and the second direction, any two adjacent first pixel units are separated by one second pixel unit, and any two adjacent second pixel units are separated by one first pixel unit. As a preferred implementation, an angle between the first direction and a row direction is 45°, and the second direction is perpendicular to the first direction and has an angle of 45° to a column direction. In this way, the sub-pixels may be arranged compactly, making full use of space and increasing an aperture ratio.

The first pixel unit and the second pixel unit each include a first sub-pixel 12, a second sub-pixel 14, a third sub-pixel 16*a*, and a fourth sub-pixel 16*b*. The first sub-pixel 12, the second sub-pixel 14, the third sub-pixel 16*a*, and the fourth sub-pixel 16*b* may be one of red sub-pixels, blue sub-pixels and green sub-pixels, respectively. Certainly, in some other embodiments, the first sub-pixel 12, the second sub-pixel 14, the third sub-pixel 16*a*, and the fourth sub-pixel 16*b* may also be sub-pixels that emit light in other colors in addition to red, green, and blue, for example, white or yellow, which are not limited herein. It is to be understood that light in different colors has different wavelengths. The longer the wavelength, the higher the energy of light. High-energy light easily causes the decay of the organic light-emitting material, so that sub-pixels that emit high-energy photons decay more easily. Blue light has a shorter wavelength than red light and green light, so the blue light has higher energy, and the organic light-emitting materials that emit blue light are more prone to decay. As a result, light emitted from the pixel unit tends to be reddish, resulting in white light color cast. Moreover, light emitted by each sub-pixel is repeatedly reflected and re-reflected between an anode and a cathode through a micro-cavity effect for amplification and constructive interference. The brightness of the light is increased, and the color cast is further amplified. As a preferred implementation, the blue sub-pixel has a larger light-emitting area than the red sub-pixel and the green sub-pixel. In this way, poor display caused by different decay rates of organic light-emitting materials emitting light in different colors can be reduced to some extent. For example, specific to the embodiments shown in FIG. 3 and FIG. 4, the first sub-pixel 12 is a blue sub-pixel, the second sub-pixel 14 is a red sub-pixel, and the third sub-pixel 16*a* and the fourth sub-pixel 16*b* are green sub-pixels. The first sub-pixel 12 has a larger light-emitting area than the second sub-pixel 14, and the second sub-pixel 14 has a larger light-emitting area than the third sub-pixel 16*a* or the fourth sub-pixel 16*b*, It is to be noted that, in some implementations, the light-emitting area of the green sub-pixel may be equal to that of the red sub-pixel. However, since the human eyes are more sensitive to the green light, in some other implementations, the light-emitting area of the green sub-pixel may be smaller than that of the red sub-pixel, which is not limited herein.

In a pixel unit, imagined co-sided triangles with no overlap is formed by taking respective centers of the first sub-pixel 12, the second sub-pixel 14, the third sub-pixel 16*a*, and the fourth sub-pixel 16*b* as vertices. Specifically, as shown in FIG. 3 and FIG. 4, the first sub-pixel 12 is located at one side of a connecting line c between the center of the third sub-pixel 16*a* and the center of the fourth sub-pixel 16*b*, and the second sub-pixel 14 is located at the other side of the connecting line c between the centers of the third sub-pixel 16*a* and the fourth sub-pixel 16*b*. The centers of the first sub-pixel 12, the second sub-pixel 14, the third sub-pixel 16*a*, and the fourth sub-pixel 16*b* are sequentially connected to form a virtual quadrilateral. The centers of the second sub-pixel 14, the first sub-pixel 12 and the third sub-pixel 16*a* are connected to form a first triangle (not shown). The centers of the second sub-pixel 14, the first sub-pixel 12 and the fourth sub-pixel 16*b* are connected to form a second triangle. The first triangle and the second triangle take a connecting line d between the center of the first sub-pixel and the center of the second sub-pixel as a common side, and the two triangles do not overlap with each other. In a preferred embodiment, the imagined co-sided triangles are acute triangles, so that the sub-pixels of the pixel structure are more uniformly arranged, which is beneficial to improve the display effect. Sub-pixel structures of the second pixel unit are mirror-symmetrical to sub-pixel structures of the first pixel unit after being rotated by a predetermined angle. That is, the sub-pixels in the first pixel unit and the sub-pixels in the same color in the second pixel unit are the same in shape and size (light-emitting area). The sub-pixel structures of the second pixel unit rotated clockwise or counterclockwise by a predetermined angle are mirror-symmetrical to the corresponding sub-pixel structures of the first pixel unit. The predetermined angle is greater than 0° and less than 360°. For example, sub-pixel arrangement structures of the second pixel unit shown in FIG. 4 are rotated clockwise by 90° to be mirror-symmetrical to sub-pixel arrangement structures of the first pixel unit shown in FIG. 3 along the first direction.

It may be understood that the pixel arrangement structure directly determines the display effect. In order to ensure the uniformity of display, as shown in FIG. 1, the sub-pixels may generally be arranged as uniformly as possible along the row direction and the column direction according to certain rules, but the pixel arrangement structure is prone to color cast, a color edge and a sense of visual granularity. By use of the pixel arrangement structure according to the embodiment of the present application, the sub-pixel arrangement structures of the second pixel unit are mirror-symmetrical to the sub-pixel arrangement structures of the first pixel unit after being rotated by a predetermined angle. In this way, arrangement compactness of the sub-pixels and pitches between the sub-pixels may be taken into account to seek a balance therebetween, which is conducive to reducing a color mixing risk and the color cast and ameliorating the color edge and the sense of visual granularity. For example, the third sub-pixel 16*a* and the fourth sub-pixel 16*b* may be set as sub-pixels to which the human eyes are sensitive, such as green sub-pixels. Each green sub-pixel may be surrounded by red sub-pixels and blue sub-pixels, effectively ameliorating the color cast. In another example, when the first pixel units and the second pixel units are repeatedly arranged to form a display matrix, after the second pixel units are rotated by a predetermined angle, the sub-pixel structures thereof are mirror-symmetrical to the sub-pixel structures of the first pixel units, so that arrangement of the sub-pixels emitting light in a same color into an individual column in the row direction or the column direction can be prevented, thereby effectively alleviating the color edge problem of the display edge. In addition, by use of the pixel arrangement structure, a distance between the sub-pixels in the same color in a same pixel unit may be appropriately enlarged. For example, a distance between the third sub-pixel 16*a* and the fourth sub-pixel 16*b* to which the human eyes are sensitive is appropriately enlarged, and the first sub-pixel 12 and the second sub-pixel 14 are close to each other, which may not only prevent the sense of granularity of display caused by identification of the two sub-pixels as one due to impossible distinction of the sub-pixels to which the human eyes are sensitive, but also can form a light-transmitting reserved region Z (see FIG. 5) with a large area between adjacent pixel units as much as possible, helping increase a lighting area of the under-screen photosensitive device.

In some embodiments, in a same pixel unit, a connecting line d between the center of the second sub-pixel 14 and the center of the first sub-pixel 12 and a connecting line c between the center of the third sub-pixel 16*a* and the center of the fourth sub-pixel 16*b* are not equal in length. It is easy to understand that sub-pixels emitting light in different colors generally have different light-emitting areas. For example, the blue sub-pixels have larger light-emitting areas than the red sub-pixels and the green sub-pixels. By designing the length of the connecting line d of centers to be unequal to that of the connecting line c of centers, the pitch between the second sub-pixel 14 and the first sub-pixel 12 and the pitch between the third sub-pixel 16*a* and the fourth sub-pixel 16*b* can be guaranteed to meet preset conditions to arrange the sub-pixels as dense as possible and improve distribution uniformity of the sub-pixels in sensitive colors, which improves visual resolution and enhances the quality of display.

In some embodiments, a connecting line a between the center of the second sub-pixel 14 and the center of the third sub-pixel 16*a* in the first pixel unit and a connecting line b between the center of the second sub-pixel 14 and the center of the fourth sub-pixel 16*b* in the first pixel unit are not equal in length. A connecting line between the center of the second sub-pixel 14 and the center of the third sub-pixel 16*a* in the second pixel unit and a connecting line between the center of the second sub-pixel 14 and the center of the fourth sub-pixel 16*b* in the second pixel unit are not equal in length. Specific to an implementation, the second sub-pixel 14 is a red sub-pixel, the first sub-pixel 12 is a blue sub-pixel, and the third sub-pixel 16*a* and the fourth sub-pixel 16*b* are green sub-pixels. Connecting lines between centers of the red sub-pixel and different green sub-pixels in a same pixel unit are not equal in length. In this way, the dislocation of the sub-pixels is strengthened, so that, when the first pixel unit and the second pixel unit are repeatedly arranged to form a display matrix, arrangement of the sub-pixels in the same color into an individual column can be further prevented, and protrusion degrees of the sub-pixels in the same row or column are weakened, thereby alleviating the color edge problem of the display edge.

It is to be noted that the center of the sub-pixel may be a geometric center of a graphic of the sub-pixel or a center of a light-emitting color of the sub-pixel, which is not limited herein.

In some embodiments, in a same pixel unit, along the first direction and the second direction, a minimum distance between two adjacent sub-pixels is n, and along the first direction and the second direction, a minimum distance between the nearest sub-pixels in different colors in two adjacent pixel units is also n, where $10\ \mu m<n<30\ \mu m$. In this way, on the one hand, the sub-pixels are arranged more uniformly, which is conducive to improving the quality of display; on the other hand, the sense of serration produced by light-emitting cross color or interference between adjacent sub-pixels can be effectively prevented.

Further, as shown in FIG. 5, a minimum distance between a second sub-pixel R1 in the first pixel unit and a third sub-pixel G21 in the second pixel unit adjacently arranged in the second direction is p, where $n<p<3n$. A minimum distance between a second sub-pixel R2 in the second pixel unit and a third sub-pixel G11 in the first pixel unit adjacently arranged in the first direction is q, where $n<q<3n$. In this way, the light-transmitting reserved region Z can be defined to have an enough size to meet the amount of light input required for the normal operation of the under-screen photosensitive device.

It is to be noted that the display panel according to the embodiment of the present application may be an organic light-emitting display panel, the sub-pixel includes at least an anode, a cathode, and a light-emitting layer between the anode and the cathode, and the driving circuit applies a voltage between the anode and the cathode to excite the migration of carriers and act on the light-emitting layer, so as to emit light. The display panel may further include a pixel definition layer (PDL). The PDL defines a plurality of pixel openings. The light-emitting layer of the sub-pixel is arranged in the pixel openings to prevent cross color or interference between adjacent sub-pixels. Therefore, an area of the pixel opening is a light-emitting area of the sub-pixel. However, due to the limitations of the vapor deposition technology, in order to ensure that the light-emitting material is completely vapor-deposited into the pixel opening, an opening area of the mask is generally larger than that of the pixel opening, so as to leave a vapor deposition margin. For example, as shown in FIG. 3, an inner side edge of the sub-pixel is called a pixel edge, which is a boundary of the pixel opening of the PDL. An outer side edge is called a virtual edge of the sub-pixel. The virtual edge is a boundary of a vapor deposition opening of the mask. Thus, in the embodiment of the present application, the pitch between the sub-pixels refers to a distance between pixel edges of two sub-pixels. Preferably, each pixel edge of each sub-pixel is parallel to its corresponding virtual edge, and vertical distances from the pixel edges to the corresponding virtual edges are equal. In this way, the final sub-pixel arrangement is more uniform and regular, which can effectively improve the manufacturing accuracy and yield of the light-emitting layer of the sub-pixel and reduce the risk of folding during net tension of the mask.

In an example, the first sub-pixel, the second sub-pixel, the third sub-pixel, and the fourth sub-pixel may be regular or irregular graphics with a major axis and a minor axis, for example, one of an ellipse, a circle, a fan, a dumbbell shape, a pear shape, a quadrilateral, a polygon, a quasi-rectangle, a rounded rectangle, a star shape and a heart shape. As shown in FIG. 5 and FIG. 6, as a preferred implementation, the first sub-pixel, the second sub-pixel, the third sub-pixel, and the fourth sub-pixel may be in the shape of a rectangle or quasi-rectangle. Major-axis directions (extension directions) of the first sub-pixel, the second sub-pixel, the third sub-pixel, and the fourth sub-pixel intersect a row direction and a column direction. In this way, on the one hand, compared with other sub-pixel shapes, the sub-pixels can be arranged densely, and the arrangement of the sub-pixels in the same color into an individual row is prevented, which effectively ameliorates the color edge phenomenon. On the other hand, the sub-pixels at irregular edges of the display panel can better match the rounded corner design, that is, the tilt of the sub-pixels is tangent to or consistent with the radian of the rounded corner, so as to realize the smooth transition of the edges of the sub-pixels at the rounded corner, thereby alleviating the problem of serration at the rounded corner. Preferably, extension directions of the first sub-pixel, the second sub-pixel, the third sub-pixel, and the fourth sub-pixel are parallel to the first direction, the row direction and the column direction are perpendicular to each other, and the first direction is at an angle of 30°-60° to the row direction or the column direction. In this way, the tilt of the sub-pixels can be further tangent to or consistent with the radian of the rounded corner, so as to realize the smooth transition of the edges of the sub-pixels at the rounded corner, thereby further alleviating the problem of serration at the rounded corner. It is to be emphasized that the human eyes are sensitive to the quality of pictures in the horizontal or vertical direction, but insensitive to the quality of pictures in a direction at an angle of 45° to the horizontal direction. Therefore, as a preferred implementation, as shown in FIG. 6, an angle between the first direction and the row direction is 45°, so as to further improve the overall quality of display. It is to be particularly noted that the force on the mask is generally transferred along the row or column direction. For example, net tensile force F of the mask is transferred along the row direction, and the opening of the mask of the corresponding sub-pixel tilting relative to the row or column direction may decompose the force in the row direction and the column direction, so as to prevent deformation of the opening caused by concentration of the net tensile force F of the FMM and reduce the manufacturing difficulty and the net tension difficulty of the mask. Moreover, with the tilt of the opening of the mask, more openings may be provided in the mask with the same length and width, thereby reducing manufacturing costs of the mask.

Specific to one embodiment, the first sub-pixel may be in the shape of a square or quasi-square, the second sub-pixel may be in the shape of a rectangle or quasi-rectangle, and the third sub-pixel and the fourth sub-pixel are in the shape of a rectangle or quasi-rectangle. In this way, the sub-pixels may be dislocated while the sub-pixels are arranged densely, thereby effectively ameliorating the color edge. It is to be noted that the quasi-rectangle or quasi-square means that due to technical limitations or for the convenience of mask manufacturing, the shape of the sub-pixels may not be strictly rectangular or square, but roughly rectangular or square, for example, may be a rounded rectangle with rounded corners or a chamfer rectangle. The rounded rectangle is a shape formed when top corners of a rectangle are rounded. The chamfer rectangle is a shape formed when one or more of the top corners of a rectangle is/are cut off. By setting the shape of the sub-pixel as a quasi-rectangle or quasi-square, an aperture ratio of the sub-pixel can be adjusted more flexibly, and restriction conditions on the manufacturing of the mask can be met.

In some embodiments, light-emitting areas of the third sub-pixel and the fourth sub-pixel are equal. For example, the third sub-pixel and the fourth sub-pixel may be set as the sub-pixels in a color to which the human eyes are sensitive, so that the display is more uniform while the resolution is as high as possible. Further, the light-emitting areas of the second sub-pixel, the third sub-pixel and the fourth sub-pixel may also be equal. In this way, the arrangement of the sub-pixels is more compact and uniform as a whole, and the display effect is improved. Specific to some embodiments, the first sub-pixel has a first major axis and a first minor axis; the second sub-pixel has a second major axis and a second minor axis; the third sub-pixel has a third major axis and a third minor axis; and the fourth sub-pixel has a fourth major axis and a fourth minor axis. That is, each sub-pixel is a regular or irregular graphic with a major axis and a minor axis, such as the rectangle or quasi-rectangle. The third sub-pixel and the fourth sub-pixel are sub-pixels in the same color, such as green sub-pixels. The third major axis and the fourth major axis are parallel to each other and have equal lengths, and the third minor axis and the fourth minor axis are parallel to each other and have equal lengths, so that the light-emitting areas of the third sub-pixel and the fourth sub-pixel are equal.

In some embodiments, a length ratio of the first major axis to the first minor axis is between 1.5 and 1; a length ratio of the second major maxis to the second minor axis is between 5 and 1; and a length ratio of the third major axis to the third minor axis is between 5 and 1. For example, in the embodiments shown in FIG. 3 and FIG. 4, the first sub-pixel is in the shape of a square, and the length ratio of the first major axis to the first minor axis is 1; the second sub-pixel, the third sub-pixel and the fourth sub-pixel are in the shape of an oblong, and length ratios of the major axes to the minor axes of the second sub-pixel, the third sub-pixel and the fourth sub-pixel are 5:1. In this way, on the premise of ensuring the aperture ratio as much as possible, the sub-pixels can be dislocated correspondingly to ameliorate the color edge phenomenon as much as possible. In addition, a light-transmitting reserved region with a larger area can also be formed between adjacent sub-pixels as much as possible to increase a lighting area of the under-screen photosensitive device.

It is to be noted that the length of the major axis of the sub-pixel refers to a maximum size of the light-emitting region of the sub-pixel in a longitudinal extension direction, and the length of the minor axis of the sub-pixel refers to a maximum size of the light-emitting region of the sub-pixel in a width direction opposite to the longitudinal extension direction of the light-emitting region.

In some embodiments, a long edge of the second sub-pixel 14 is parallel to a set of opposite edges of the first sub-pixel 12, a long edge of the third sub-pixel 16*a*, and a long edge of the fourth sub-pixel 16*b*. It may be understood that the first sub-pixel is in the shape of a square or quasi-square, so a set of opposite sides opposite to each other are parallel to each other and have equal lengths, while the third sub-pixel and the fourth sub-pixel are in the shape of a rectangle or quasi-rectangle, so they have a set of long edges parallel to each other and a set of short edges parallel to each other. For example, as shown in FIG. 3, the first sub-pixel 12 has a first edge and a second edge opposite to the third sub-pixel 16*a* and the fourth sub-pixel 16*b* respectively, a third edge adjacent to the first edge and opposite to the second edge, and a fourth edge opposite to the first edge and adjacent to the second edge and the third edge. The first edge and the fourth edge of the first sub-pixel 12 are parallel to the long edge of the second sub-pixel 14, and are parallel to the long edges of the third sub-pixel 16*a* and the fourth sub-pixel 16*b*. This helps arrange the sub-pixels uniformly, thereby improving the quality of display.

In some embodiments, in the first pixel unit, an extension line of one edge of the first sub-pixel 12 near a margin of the first pixel unit overlaps with an extension line of a short edge of the third sub-pixel 16*a* near the same margin of the first pixel unit. An extension line of the other edge of the first sub-pixel 12 near the margin of the first pixel unit overlaps with an extension line of a long edge of the fourth sub-pixel 16*b* near the same margin of the first pixel unit. Specific to an embodiment, in one pixel unit, the third edge of the first sub-pixel 12 may be collinear with the short edge of the third sub-pixel 16*a*, and the fourth edge of the first sub-pixel 12 may be collinear with the long edge of the fourth sub-pixel. In this way, the pixel units are ensured to have a regular shape as much as possible, so that the arrangement of sub-pixels is more compact and uniform.

In some embodiments, as shown in FIG. 3 and FIG. 4, an extension line of the second edge of the first sub-pixel 12 does not overlap with the third sub-pixel 16*a*, and an extension line of the first edge does not overlap with the fourth sub-pixel 16*b*. In this way, the dislocation between the sub-pixels is ensured, protrusion degrees of the sub-pixels of the display edge are weakened, and the color edge problem of the display edge is effectively alleviated.

In some embodiments, lengths of the long edges of the second sub-pixel, the third sub-pixel and the fourth sub-pixel may be equal to an edge length of the first sub-pixel. In this way, the first pixel unit is further ensured to have a regular shape, so that the arrangement of sub-pixels is more compact and uniform.

In some embodiments, in the first pixel unit, an extension line of at least one of the two long edges of the second sub-pixel 14 passes through a gap between the first sub-pixel 12 and the third sub-pixel 16*a*. Further, an extension line of one long edge of the second sub-pixel 14 passes through the gap between the first sub-pixel 12 and the third sub-pixel 16*a*, and the extension line of the other long edge of the second sub-pixel 14 overlaps with the edge of the first sub-pixel 12 near the third sub-pixel 16*a*. For example, as shown in FIG. 3, an extension line of one long edge of the second sub-pixel 14 passes between the first sub-pixel 12 and the third sub-pixel 16*a*. An extension line of the other long edge of the second sub-pixel 14 is collinear with the first edge of the first sub-pixel. In the second pixel unit, an extension line of at least one of the two long edges of the second sub-pixel 14 passes through a gap between the first sub-pixel 12 and the fourth sub-pixel 16*b*. Further, an extension line of one long edge of the second sub-pixel 14 passes through the gap between the first sub-pixel 12 and the fourth sub-pixel 16*b*, and an extension line of the other long edge of the second sub-pixel 14 overlaps with the edge of the first sub-pixel 12 near the fourth sub-pixel 16*b*. For example, as shown in FIG. 4, an extension line of one long edge of the second sub-pixel 14 passes between the first sub-pixel 12 and the fourth sub-pixel 16*b*. An extension line of the other long edge of the second sub-pixel 14 is collinear with the first edge of the first sub-pixel. In this way, on the premise of uniform arrangement of the sub-pixels, the size of the light-transmitting reserved region is guaranteed as much as possible, which is conducive to the realization of, for example, under-screen camera functions. Certainly, in some other embodiments, in the first pixel unit, the extension lines of the two long edges of the second sub-pixel 14 both pass through the gap between the first sub-pixel 12 and the third sub-pixel 16*a*. That is, the second sub-pixel 14 can be translated along a direction opposite to the first direction so as to pass between the first sub-pixel 12 and the third sub-pixel 16*a*. In the second pixel unit, the extension lines of the two long edges of the second sub-pixel 14 pass through the gap between the first sub-pixel 12 and the fourth sub-pixel 16*b*. That is, the second sub-pixel 14 can be translated along a direction opposite to the second direction to pass between the first sub-pixel 12 and the fourth sub-pixel 16*b*.

Referring to FIG. 5 and FIG. 6, in some embodiments of the present application, two first pixel units and two second pixel units adjacent to each other form a repetitive unit (as shown by the dotted box in FIG. 6). The plurality of repetitive units are arranged along the first direction X and the second direction Y. Each repetitive unit includes two first pixel units and two second pixel units. The two second pixel units are located at two sides of a connecting line between geometric centers of the two first pixel units, respectively. For example, as shown in FIG. 5 and FIG. 6, the plurality of repetitive units are arranged along the first direction and the second direction to form a display matrix. It may be understood that, with the application of a notch screen or hole screen technology, the sense of serration of an irregular edge region (such as a curved region) is also a factor to affect the quality of display. The sub-pixels in different rows form a stepped shape along the extension direction of the irregular edge region, thereby strengthening the sense of serration of images at the irregular region when the display panel displays the images, which affects the display effect of the display panel. Therefore, as an implementation, the plurality of repetitive units may be arranged along the first direction (X direction) and the second direction (Y direction) intersecting the row direction and the column direction. With the repeated arrangement of the repetitive units, a connecting line of edges of a plurality of sub-pixels located at irregular edges of a display region tend to overlap with or be parallel to tangent lines of the irregular edges, so that the connecting line of the edges of the plurality of sub-pixels are more smooth and close to the shape of the irregular edges, thereby ameliorating the sense of serration of images at the irregular edges and helping improve the display effect of the display panel. In addition, the sub-pixels located at the irregular edges of the display region may also include a plurality of colors, so as to further ameliorate the color edges formed at the irregular edges of the display panel, thereby improving the display effect of the display panel.

In some embodiments, as shown in FIG. 5 and FIG. 6, in one repetitive unit, in any of the second pixel units and the first pixel unit adjacent thereto in the first direction X, a length of a connecting line between the center of the second sub-pixel R2 and the center of the third sub-pixel G21 in the second pixel unit is L1, and a length of a connecting line between the center of the second sub-pixel R1 in the first pixel unit and the center of the third sub-pixel G21 in the second pixel unit is L2. L1 is not equal to L2. In the second pixel unit and the other first pixel unit adjacent thereto in the second direction Y, a length of a connecting line between the center of the second sub-pixel R2 in the second pixel unit and the center of the fourth sub-pixel G12 in the other first pixel unit is L3, and in the other first pixel unit, a length of a connecting line between the center of the second sub-pixel R1 and the center of the fourth sub-pixel G12 is L4. L3 is not equal to L4. That is, in a same repetitive unit, lengths of connecting lines between centers of a plurality of red sub-pixels and centers of a plurality of green sub-pixels in two adjacent pixel units are different. In this way, the dislocation of the sub-pixels is ensured, so that, when the first pixel unit and the second pixel unit are repeatedly arranged to form a display matrix, arrangement of the sub-pixels in the same color into an individual column can be further prevented, and protrusion degrees of the sub-pixels in the same row or column are weakened, thereby alleviating the color edge problem of the display edge.

In some embodiments, as shown in FIG. 6, in one of the repetitive units, in any of the second pixel units and the first pixel unit adjacent thereto in the first direction X, connecting lines between centers of the second sub-pixel R2 and the third sub-pixel G21 in the second pixel unit and the second sub-pixel R1 in the first pixel unit form a scalene triangle S1. Moreover, in the second pixel unit and the other first pixel unit adjacent thereto in the second direction Y, connecting lines between centers of the second sub-pixel R1 and the fourth sub-pixel G12 in the other first pixel unit and the second sub-pixel R2 in the second pixel unit form a scalene triangle S2. That is, in a same repetitive unit, connecting lines between a red sub-pixel in one second pixel unit and a red sub-pixel and different green sub-pixels in the first pixel unit adjacent to the second pixel unit in the row direction and the column direction may form scalene triangles, respectively. In this way, when the first pixel unit and the second pixel unit are repeatedly arranged to form a display matrix, arrangement of the sub-pixels in the same color into an individual column can also be further prevented, and protrusion degrees of the sub-pixels in the same row or column are weakened, thereby alleviating the color edge problem of the display edge.

In some embodiments, in one of the repetitive units, a connecting line between the centers of any two of the second sub-pixels does not overlap with a connecting line between the center of any one of the second sub-pixels and the center of the third sub-pixel, and the connecting line between the centers of the any two second sub-pixels does not overlap with a connecting line between the center of any one of the second sub-pixels and the center of the fourth sub-pixel. For example, in some embodiments, the second sub-pixel is a red sub-pixel, the first sub-pixel is a blue sub-pixel, and the third sub-pixel and the fourth sub-pixel are green sub-pixels. A connecting line between any two red sub-pixels, for example, a connecting line of centers between the second sub-pixels R1 and R2 in adjacent pixel units, is not collinear with a connecting line of centers between any two of R1/R2 and G11/G12/G2l/G22. For example, as shown in FIG. 6, a connecting line LL1 of centers between the second sub-pixels R1 and R2 does not overlap with a connecting line LL2 of centers between the second sub-pixel R1 and the fourth sub-pixel G21 in the adjacent pixel unit. In other words, in a same repetitive unit, a connecting line between centers of two red sub-pixels R1 and R2 in the first pixel unit and the second pixel unit adjacent to each other along the first direction passes a gap between the blue sub-pixel B2 and the green sub-pixel G21 in a same pixel unit of the first pixel unit and the second pixel unit adjacent to each other. Similarly, a connecting line between centers of two red sub-pixels R1 and R2 in the first pixel unit and the second pixel unit adjacent to each other along the second direction passes a gap between the blue sub-pixel B1 and the green sub-pixel G11 in a same pixel unit of the first pixel unit and the second pixel unit adjacent to each other. In this way, the pixel arrangement structure can prevent arrangement of the sub-pixels emitting color in a same color into an individual column as a whole, and protrusion degrees of the sub-pixels on the display edge are further weakened, thereby effectively alleviating the color edge problem of the display edge.

In some embodiments, as shown in FIG. 6, in one of the repetitive units, first virtual connecting lines passing through the centers of the first sub-pixels and the centers of the third sub-pixels in the two first pixel units are parallel to each other; second virtual connecting lines passing through the centers of the first sub-pixels and the centers of the fourth sub-pixels in the two second pixel units are parallel to each other; and the first virtual connecting lines do not overlap with the second virtual connecting lines. Specific to embodiments, as shown in FIG. 5 and FIG. 6, in a same repetitive unit, connecting lines between centers of B1 and G11 are parallel to each other, that is, LL3 and LL4 are parallel to each other, and connecting lines between centers of B2 and G22 are parallel to each other, that is, LL5 and LL6 are parallel to each other. Besides, in a same repetitive unit, extension lines of central lines of the blue sub-pixels and the green sub-pixels in two pixel units with a same sub-pixel structure are not collinear. In this way, the pixel arrangement structure can prevent arrangement of the sub-pixels emitting color in a same color into an individual column as a whole, and protrusion degrees of the sub-pixels on the display edge are weakened, thereby effectively alleviating the color edge problem of the display edge.

In some embodiments, as shown in FIG. 6, in one repetitive unit, extension lines of a connecting line between centers of the first sub-pixel and the second sub-pixel in one first pixel unit and a connecting line between centers of the first sub-pixel and the second sub-pixel in the other first pixel unit do not overlap. That is, LL7 and LL8 do not overlap. Extension lines of a connecting line between centers of the first sub-pixel and the second sub-pixel in one second pixel unit and a connecting line between centers of the first sub-pixel and the second sub-pixel in the other second pixel unit do not overlap. Extension lines of a connecting line between centers of the first sub-pixel and the second sub-pixel in any first pixel unit and a connecting line between centers of the first sub-pixel and the second sub-pixel in any second pixel unit do not overlap. That is, as shown in FIG. 5 and FIG. 6, in a same repetitive unit, extension lines of connecting lines between centers of red sub-pixels and blue sub-pixels in different pixel units are not collinear. For example, two connecting lines between centers of red sub-pixels R1 and blue sub-pixels B1 in two first pixel units, and two connecting lines between centers of red sub-pixels R2 and blue sub-pixels B2 in two second pixel units are all not collinear. It may be understood that, since the first sub-pixel and the second sub-pixel are located on two sides of a connecting line between the center of the third sub-pixel and the center of the fourth sub-pixel, the connecting lines between centers of red sub-pixels and blue sub-pixels in different pixel units of a same repetitive unit being not collinear enables the sub-pixels in a same column to include a plurality of colors, thereby effectively alleviating the color edge problem of the display edge.

In some embodiments, in one of the repetitive units, third virtual connecting lines passing through the centers of the second sub-pixels and the centers of the third sub-pixels in each first pixel unit are parallel to each other; fourth virtual connecting lines passing through the centers of the second sub-pixels and the centers of the fourth sub-pixels in each second pixel unit are parallel to each other; and the third virtual connecting lines do not overlap with the fourth virtual connecting lines. Specific to embodiments, as shown in FIG. 5 and FIG. 6, in a same repetitive unit, extension lines of connecting lines between centers of the red sub-pixels and the green sub-pixels in two pixel units with a same sub-pixel structure are not collinear. In this way, the pixel arrangement structure can prevent arrangement of the sub-pixels emitting color in a same color into an individual column as a whole, and protrusion degrees of the sub-pixels on the display edge are weakened, thereby effectively alleviating the color edge problem of the display edge.

It is also worth emphasizing that an amount of light input and contrast of light signals received by the under-screen photosensitive device may affect the quality of the generated image of the object. Although the display panel with other pixel arrangement structures has more light-transmitting regions so that an overall light-transmitting area has no difference, a continuous light-transmitting region in a specific region has a small area, which cannot meet the light transmittance required by the normal operation of the under-screen photosensitive device. In some embodiments of the present application, in the first pixel unit and the second pixel unit adjacent to each other in the first direction X, a distance between the second sub-pixel R1 in the first pixel unit and the fourth sub-pixel G21 in the second pixel unit is greater than distances between the third sub-pixel G11 in the first pixel unit and the first sub-pixel R1 and between the fourth sub-pixel G12 and the first sub-pixel R1. As shown in FIG. 5, for example, L5 is greater than L6, and L5 is greater than L7. In this way, a continuous light-transmitting reserved region Z may be formed in each repetitive unit, so as to improve the light transmittance of the display panel, providing convenience for the diversification of functions of the display panel. As an implementation, an area of the light-transmitting reserved region Z is greater than the light-emitting area of one second sub-pixel R1/R2.

It may be understood that each repetitive unit includes two first pixel units, two second pixel units and a light-transmitting reserved region formed by intervals between adjacent sub-pixels. Preferably, each repetitive unit is located in a virtual square. When the repetitive units are arranged in an array, a plurality of virtual squares are arranged in an array with shared sides to form a display matrix. In this way, the uniformity of display and the display effect are improved.

In some embodiments, as shown in FIG. 7, the pixel arrangement structure includes a virtual polygon formed by four virtual quadrilaterals arranged with shared sides. The four virtual quadrilaterals specifically include a first virtual quadrilateral 30, a second virtual quadrilateral 40, a third virtual quadrilateral 50 and a fourth virtual quadrilateral 60. The first virtual quadrilateral 30 shares a first shared side g with the third virtual quadrilateral 50 along the row direction, and shares a second shared side h with the second virtual quadrilateral 40 along the column direction. The fourth virtual quadrilateral 60 shares a third shared side j with the third virtual quadrilateral 50 along the column direction, and shares a fourth shared side i with the second virtual quadrilateral 40 along the row direction. Sides of the first virtual quadrilateral 30, the second virtual quadrilateral 40, the third virtual quadrilateral 50 and the fourth virtual quadrilateral 60 away from the shared sides form sides of the virtual polygon. The first sub-pixel is located at the first vertex of each virtual quadrilateral, the second sub-pixel is located at the second vertex of each virtual quadrilateral, the first vertex and the second vertex are arranged alternately and spaced, and the green sub-pixel is located in each virtual quadrilateral.

Further, any side of each of the virtual quadrilaterals is not parallel to the row or column direction; or any two sides of each of the virtual quadrilaterals are not equal in length; or any two sides of each of the virtual quadrilaterals are not parallel to each other; or any two inner angles of each of the virtual quadrilaterals are not equal. In this way, the first virtual quadrilateral, the second virtual quadrilateral, the third virtual quadrilateral and the fourth virtual quadrilateral are all irregular quadrilaterals, so that a large light-transmitting region may be formed on the premise of meeting compact arrangement of the sub-pixels, thereby further improving the light transmittance of the display panel and providing the convenience for the diversification of functions of the display panel.

In some embodiments, in one pixel unit, along the first direction X, an opening region of the first sub-pixel is staggered with an opening region of the second sub-pixel and an opening region of the third sub-pixel. That is, the opening region of the second sub-pixel has no projection overlapping area with an opening of the first sub-pixel and an opening of the third sub-pixel along the first direction X. In this way, the arrangement between the sub-pixels may be more compact. In some other embodiments, at least an extension line of one side edge of the second sub-pixel away front the fourth sub-pixel does not pass through the opening region of the third sub-pixel. For example, the opening region of the second sub-pixel may partially overlap with the opening region of the first sub-pixel along the first direction X, but does not overlap with the opening region of the third sub-pixel.

In some embodiments, a connecting line between the centers of the green sub-pixels in a same row and/or column is a non-straight line or an approximate straight line. For example, as shown in FIG. 5 and FIG. 6, a connecting line between the centers of the green sub-pixels in a same row and/or column is zigzag. Connecting lines between centers of two green sub-pixels in any pixel group of odd-numbered rows or columns and two nearest green sub-pixels in a pixel group of even-numbered rows or columns adjacent thereto form a fifth virtual quadrilateral. A minimum inner angle in the fifth virtual quadrilateral is $\gamma \geq 60°$. In this way, the green sub-pixels in the adjacent pixel groups are not too close, so as to further prevent visual integration of two adjacent green sub-pixels by the human eyes caused by difficult distinction between the two adjacent green sub-pixels due to a short distance between the adjacent green sub-pixels.

A display panel is further provided in the first aspect of the present application, including the pixel arrangement structure in the above embodiments.

Referring to FIG. 3 to FIG. 7 again, the pixel arrangement structure according to the present application further has the following features.

The pixel arrangement structure according to the present application includes a first pixel unit. The first pixel unit includes a first sub-pixel 12, a second sub-pixel 14, a third sub-pixel 16*a*, and a fourth sub-pixel 16*b*, The first sub-pixel 12, the second sub-pixel 14, the third sub-pixel 16*a*, and the fourth sub-pixel 16*b* may be one of blue sub-pixels, red sub-pixels and green sub-pixels, respectively. Certainly, in some other embodiments, the first sub-pixel 12, the second sub-pixel 14, the third sub-pixel 16*a*, and the fourth sub-pixel 16*b* may also be sub-pixels that emit light in other colors in addition to blue, red and green. For example, the third sub-pixel or the fourth sub-pixel may be a white or yellow sub-pixel, which is not limited herein. It is to be understood that light in different colors has different wavelengths. The shorter the wavelength, the higher the energy of light. High-energy light easily causes the decay of the organic light-emitting material, so that sub-pixels that emit high-energy photons decay more easily. Blue light has a shorter wavelength than red light and green light, so the blue light has higher energy, and the organic light-emitting materials that emit blue light are more prone to decay. As a result, light emitted from the pixel unit tends to be reddish, resulting in white light color cast. Moreover, light emitted by each sub-pixel is repeatedly reflected and re-reflected between an anode and a cathode through a Fabry-Perot microcavity effect for amplification and constructive interference. The brightness of the light is increased, and the color cast is further amplified. As a preferred implementation, as shown in FIG. 3 and FIG. 4, the first sub-pixel 12 is a blue sub-pixel, the second sub-pixel 14 is a red sub-pixel, and the third sub-pixel 16*a* and the fourth sub-pixel 16*b* are green sub-pixels. The blue sub-pixel has a larger light-emitting area than the red sub-pixel and the green sub-pixel. In this way, poor display caused by different decay rates of organic light-emitting materials emitting light in different colors can be reduced to some extent. It is to be noted that, in some implementations, the light-emitting area of the green sub-pixel may be equal to that of the red sub-pixel. However, since the human eyes are more sensitive to the green light than the red light, in some other implementations, the light-emitting area of the green sub-pixel may be smaller than that of the red sub-pixel, which is not limited herein.

In the first pixel unit, imagined co-sided triangles with non-overlapping areas is formed with the centers of the first sub-pixel 12, the second sub-pixel 14, the third sub-pixel 16*a* and the fourth sub-pixel 16*b* as vertices; and the center of the first sub-pixel 12 and the center of the second sub-pixel 14 are taken as vertices of a common side of the imagined co-sided triangle. Specifically, as shown in FIG. 3 and FIG. 4, the first sub-pixel 12 is located at one side of a connecting line c between the centers of the third sub-pixel 16*a* and the fourth sub-pixel 16*b*, and the second sub-pixel 14 is located at the other side of the connecting line c between the centers of the third sub-pixel 16*a* and the fourth sub-pixel 16*b*. The centers of the first sub-pixel 12, the second sub-pixel 14, the third sub-pixel 16*a*, and the fourth sub-pixel 16*b* are sequentially connected to form a virtual quadrilateral. Midpoints of the second sub-pixel 12, the first sub-pixel 14 and the third sub-pixel 16*a* are connected to form a first triangle (not shown). The centers of the second sub-pixel 12, the first sub-pixel 14 and the fourth sub-pixel 16*b* are connected to form a second triangle. The first triangle and the second triangle take a connecting line d between the center of the first sub-pixel and the center of the second sub-pixel as a common side, which are imagined co-sided triangles, and areas of the two triangles do not overlap with each other. In a preferred embodiment, the imagined co-sided triangles are acute triangles, so that the sub-pixels of the pixel structure are more uniformly arranged, which is beneficial to improve the display effect.

The second sub-pixel has a second major axis and a second minor axis, and in the first pixel unit, a center line of the second sub-pixel along the second major axis of the second sub-pixel does not pass through the center of the third sub-pixel and/or the center of the fourth sub-pixel. It may be understood that the major-axis direction of the sub-pixel refers to a longitudinal extension direction of the light-emitting region of the sub-pixel, and the minor axis of the sub-pixel refers to a width direction of the light-emitting region of the sub-pixel opposite to the longitudinal extension direction of the light-emitting region. Therefore, the center line of the second sub-pixel along its major axis is a straight line that passes through the center of the second sub-pixel along the longitudinal extension direction of the light-emitting region of the sub-pixel. For example, as shown in FIG. 3, the first triangle and the second triangle are imagined co-sided with the connecting line d between the center of the first sub-pixel 12 and the center of the second sub-pixel 14. The center line of second sub-pixel 14 along its major axis refers to a straight line passing through its center and extending along its major axis. The center line of the second sub-pixel along its major axis does not pass through the center of the third sub-pixel and/or the center of the fourth sub-pixel, so that the sub-pixels in the first pixel unit can be dislocated, thereby effectively alleviating the color edge problem. Further, a projection of a vertex of a common side of the imagined co-sided triangle on an opposite side opposite to the vertex is on the opposite side of the vertex, and the projection does not overlap with the center of the third sub-pixel and/or the center of the fourth sub-pixel. For example, as shown in FIG. 3, a projection of the center of the second sub-pixel 14 (one vertex of the connecting line d of centers) on an opposite side e opposite thereto (a connecting line between the center of the first sub-pixel and the center of the third sub-pixel) is on the opposite side e. Moreover, the projection is located between the center of the first sub-pixel 12 and the center of the third sub-pixel 16*a*, that is, does not overlap with the center of the third sub-pixel 16*a*. Correspondingly, a projection of the center of the first sub-pixel 12 (the other vertex of the connecting line d of centers) on an opposite side b opposite thereto (a connecting line between the center of the first sub-pixel and the center of the fourth sub-pixel) is on the opposite side b. Moreover, the projection is located between the center of the first sub-pixel 14 and the center of the fourth sub-pixel 16*b*, that is, does not overlap with the center of the fourth sub-pixel 16*b*. As a preferred implementation, the projection of the vertex of the common side of the imagined co-sided triangle on the opposite side of the vertex is adjacent to or at a center point of the opposite side of the vertex. In this way, the sub-pixels are arranged more uniformly, which further prevents the color edge phenomenon and helps improve the quality of display.

It is to be noted that the projection of the vertex of the common side on the opposite side of the vertex refers to a projection of the vertex on the opposite side of the vertex along a direction perpendicular to the opposite side of the vertex. That is, an intersection point between a perpendicular line passing through the vertex and perpendicular to the opposite side of the vertex and the opposite side of the vertex is the projection of the vertex on the opposite side of the vertex. For example, as shown in FIG. 3, one vertex of a common side d of the first triangle and the second triangle is the center of the second sub-pixel 14, and an intersection point between a perpendicular line passing through the center of the second sub-pixel 14 and perpendicular to an opposite side e opposite thereto and the opposite side e is the projection of the vertex on the opposite side opposite thereto.

It may be understood that the pixel arrangement structure directly determines the display effect. In order to ensure the uniformity of display, the sub-pixels may generally be arranged as uniformly as possible along the row direction and the column direction according to certain rules, but the pixel arrangement structure is prone to a color edge and a sense of visual granularity. The pixel arrangement structure may take into account the arrangement uniformity, compactness and pitches between the sub-pixels to seek a balance among the three, which is conducive to reducing the color mixing risk and ameliorating the color edge and the sense of visual granularity. For example, when the display matrix is formed, the sub-pixels are staggered due to the above restrictions, so as to prevent arrangement of the sub-pixels emitting light in a same color into an individual column, which alleviates the color edge problem of the display edge. Moreover, the staggered sub-pixels enable the sub-pixels at a rounded corner of the display panel to better match the rounded corner design. That is, smooth transition of a line of edges of the sub-pixels at the rounded corner is tangent to or consistent with a radian of the rounded corner, so as to alleviate the problem of serration at the rounded corner. In addition, by use of the pixel arrangement structure, a distance between sub-pixels in a same color in a same pixel unit may be appropriately enlarged. For example, a distance between the third sub-pixel and the fourth sub-pixel, to which the human eyes are sensitive, is appropriately enlarged, and the first sub-pixel and the second sub-pixel are close to each other, so as to prevent the sense of granularity of display caused by identification as one due to impossible distinction of the sub-pixels to which the human eyes are sensitive.

It is also worth emphasizing that an amount of light input and contrast of light signals received by the under-screen photosensitive device may affect the quality of the generated image. Although the display panel with other pixel arrangement structures has more light-transmitting regions so that an overall light-transmitting area has no difference, a continuous light-transmitting region in a specific region has a small area, which cannot meet the light transmittance required by the normal operation of the under-screen photosensitive device. With the above restrictions of pixel arrangement, a light-transmitting reserved region may also be formed in a pixel unit by dislocation, which is conducive to the realization of the manufacturing of a display screen such as an under-screen camera. For example, as shown in FIG. 5 and FIG. 6, the first pixel unit and the second pixel unit also include a blank region arranged adjacent to second sub-pixel 14. The blank region is the light-transmitting reserved region Z, which may be preset to allow outside light to penetrate to the under-screen photosensitive device. Specific to one embodiment, the light-transmitting reserved region has a size ranging from 10 μm to 90 μm in the first direction, and has a size ranging from 20 μm to 90 μm in the second direction.

In some embodiments, the pixel arrangement structure further includes a plurality of second pixel units. The first pixel units and the second pixel units are adjacent to each other, and the plurality of first pixel units and the plurality of second pixel units are alternately arranged in a first direction and a second direction. For example, as shown in FIG. 5, the first direction is the X direction, and the second direction is the Y direction. In the first direction, the first pixel units and the second pixel units are alternately arranged. In the second direction, the first pixel units and the second pixel units are alternately arranged. That is, in the first direction and the second direction, any two adjacent first pixel units are separated by one second pixel unit, and any two adjacent second pixel units are separated by one first pixel unit. It may be understood that, in some other embodiments, the first direction and the second direction may also be other directions intersecting the row direction and the column direction, which are not limited herein. For example, as shown in FIG. 6, an angle between the first direction and the row direction is 45°, and the second direction is perpendicular to the first direction and has an angle of 45° to the column direction.

In some embodiments, sub-pixel structures of the second pixel unit are mirror-symmetrical to sub-pixel structures of the first pixel unit after being rotated by a predetermined angle. That is, the sub-pixels in the first pixel unit and the sub-pixels in the same color in the second pixel unit are the same in shape and size (light-emitting area). The sub-pixel structures after the sub-pixels in the second pixel unit are mirror-symmetrical to the corresponding sub-pixel structures of the first pixel unit after being rotated clockwise or counterclockwise by a predetermined angle. The predetermined angle is greater than 0° and less than 360. For example, sub-pixel arrangement structures of the second pixel unit shown in FIG. 4 are rotated by 90° to be mirror-symmetrical to sub-pixel arrangement structures of the first pixel unit shown in FIG. 3 along the first direction. In this way, arrangement of the sub-pixels emitting color in a same color into an individual column in the row direction or the column direction is prevented, and protrusion degrees of the sub-pixels in a same row or column are weakened, thereby effectively alleviating the color edge problem of the display edge. The color cast may also be effectively ameliorated at the same time. For example, the third sub-pixel and the fourth sub-pixel may be set as sub-pixels to which the human eyes are sensitive, such as green sub-pixels. Each green sub-pixel may be surrounded by red sub-pixels and blue sub-pixels, so that the color mixing is more uniform and the color cast is ameliorated. In addition, the sub-pixel structures in the second pixel unit are mirror-symmetrical to the sub-pixel structures of the first pixel unit after being rotated by a predetermined angle, and a light-transmitting reserved region Z (see FIG. 6) with a large area can be formed between adjacent pixel units as much as possible, which is conducive to increasing a lighting area of the under-screen photosensitive device. It may be understood that, in some other embodiments, the sub-pixel structures of the first pixel unit and the second pixel unit may also be the same, which is not limited herein. That is, a minimum repetitive unit in the pixel arrangement structure is a pixel unit.

Further, in some embodiments, in the first direction, the first pixel unit and the second pixel unit adjacent thereto form a first pixel group. In the second direction, the first pixel unit and the second pixel unit adjacent thereto form a second pixel group. In other words, in the first direction, one first pixel unit and one second pixel unit adjacent thereto form a first pixel group; in the second direction, one first pixel unit and one second pixel unit adjacent thereto form a second pixel group. Specific to the embodiments shown in FIG. 5, FIG. 6 and FIG. 7, taking a pixel unit as units, two first pixel units and two second pixel units form a repetitive unit, and the two second pixel units are located at two sides of a connecting line of geometric centers of the two first pixel units respectively. Taking a pixel group as units, two adjacent first pixel groups or two adjacent second pixel groups form a repetitive unit. A plurality of repetitive units are arranged in the first direction and the second direction. The center of the third sub-pixel or the center of the fourth sub-pixel in the first pixel group is located at an outer side of a connecting line between centers of the two second sub-pixels in the first pixel group, and/or the center of the third sub-pixel or the center of the fourth sub-pixel in the second pixel group is located at an outer side of a connecting line between centers of the two second sub-pixels in the second pixel group. In this way, on the premise of ensuring the arrangement of the sub-pixels as uniform as possible, the sub-pixels can be dislocated, so that, when the repetitive units are repeatedly arranged to form a display matrix, arrangement of the sub-pixels in the same color into an individual column can be further prevented, and protrusion degrees of the sub-pixels in the same row or column are weakened, thereby alleviating the color edge problem of the display edge. It is to be noted that the SPR technology is used so as to improve the resolution, and in order to achieve full color display, there is a need to borrow colors that cannot be displayed from neighboring sub-pixels. Therefore, the uniform arrangement of the sub-pixels means that the distances between the sub-pixels are within a reasonable range, so as to prevent a poor display effect caused by excessively short and close distances between sub-pixels in some regions of the pixel arrangement structure and excessively long and loose distances between sub-pixels in some regions.

It may be understood that, with the application of a notch screen or hole screen technology, the sense of serration of an irregular edge region (such as a curved region) is also a factor to affect the quality of display. The inventor of the present application has found from study that the sub-pixels in different rows form a stepped shape along the extension direction of the irregular edge region, thereby strengthening the sense of serration of images at the irregular region when the display panel displays the images, which affects the display effect of the display panel. Therefore, as an implementation, the plurality of repetitive units may be arranged along the first direction and the second direction intersecting the row direction and the column direction. With the repeated arrangement of the repetitive units, a connecting line of edges of a plurality of sub-pixels located at irregular edges of a display region tend to overlap with or be parallel to tangent lines of the irregular edges, so that the connecting line of the edges of the plurality of sub-pixels are more smooth and close to the shape of the irregular edges, thereby ameliorating the sense of serration of images at the irregular edges and helping improve the display effect of the display panel. In addition, the sub-pixels located at the irregular edges of the display region may also include a plurality of colors, so as to further ameliorate the color edges formed at the irregular edges of the display panel, thereby improving the display effect of the display panel. Preferably, the first direction and the second direction are perpendicular to each other, and an angle between the first direction and the row direction is preferably 45'°.

In some embodiments, the center of the third sub-pixel 16*a* or the center of the fourth sub-pixel 16*b* is located at an outer side of a connecting line between the center of the second sub-pixel 14 in the first pixel unit and the center of the second sub-pixel 14 in the second pixel unit adjacent to the first pixel unit. In other words, the center of the third sub-pixel 16*a* or the center of the fourth sub-pixel 16*b* in one pixel unit is located at an outer side of a connecting line between the center of the second sub-pixel 14 in the pixel unit and the center of the second sub-pixel 14 in the other pixel unit adjacent thereto. For example, specific to some embodiments, as shown in FIG. 5 and FIG. 6, an extension line of a connecting line between the center of the second sub-pixel R1 in the first pixel unit and the center of the second sub-pixel R2 in the second pixel unit adjacent to the first pixel unit is staggered with the center of the third sub-pixel G11 and the center of the fourth sub-pixel G12 in the first pixel unit, and the center of the third sub-pixel G11 and the center of the fourth sub-pixel G12 are located on two sides of the extension line of the above connecting line. It is to be noted that the center of the sub-pixel being located at an outer side of the connecting line of centers means that the center of the sub-pixel is staggered with the connecting line of centers and the extension line thereof. For example, the center of the sub-pixel is located at one side of the connecting line of centers or the extension line thereof.

As a preferred implementation, the first sub-pixels and the second sub-pixels may be blue sub-pixels and red sub-pixels respectively, and the third sub-pixels and the fourth sub-pixels may be green sub-pixels. The green sub-pixels have a smaller light-emitting area than the blue and red sub-pixels. In a same pixel unit, a connecting line d between the center of the first sub-pixel and the center of the second sub-pixel and a connecting line c between the center of the third sub-pixel 16*a* and the center of the fourth sub-pixel 16*b* are not equal in length. It is easy to understand that sub-pixels emitting light in different colors generally have different light-emitting areas. For example, the blue sub-pixels have larger light-emitting areas than the red sub-pixels and the green sub-pixels. By designing the length of the connecting line d of centers to be unequal to that of the connecting line c of centers, the pitch between the first sub-pixel and the second sub-pixel and the pitch between the third sub-pixel and the fourth sub-pixel can be guaranteed to meet preset conditions to arrange the sub-pixels as dense as possible and improve distribution uniformity of the sub-pixels in sensitive colors, which improves visual resolution and enhances the quality of display.

As shown in FIG. 3 and FIG. 4, in one pixel unit, a length of a connecting line e between the center of the first sub-pixel and the center of the third sub-pixel is not equal to a length of a connecting line a between the center of the first sub-pixel and the center of the fourth sub-pixel in the same pixel unit. Specific to one embodiment, the first sub-pixel is a blue sub-pixel, the second sub-pixel is a red sub-pixel, and the third sub-pixel and the fourth sub-pixel are green sub-pixels. Connecting lines between centers of the blue sub-pixel and different green sub-pixels in a same pixel unit are not equal in length. In some other embodiments, in one pixel unit, distances from the center of the third sub-pixel and the center of the fourth sub-pixel to the center of the second sub-pixel respectively are not equal. In this way, on the one hand, adjacent sub-pixels are not too close, so as to further prevent visual integration of two adjacent sub-pixels in the same colors by the human eyes caused by difficult distinction between two adjacent sub-pixels in the same color due to a short distance between the adjacent sub-pixels. On the other hand, by setting the lengths of the connecting lines between the centers of the first sub-pixel and the second sub-pixel and the centers of the third sub-pixel and the fourth sub-pixel to be different, the dislocation of the sub-pixels is strengthened, so that, when the first pixel unit and the second pixel unit are repeatedly arranged to form a display matrix, arrangement of the sub-pixels in the same color into an individual column can be further prevented, and protrusion degrees of the sub-pixels in the same row or column are weakened, thereby alleviating the color edge problem of the display edge.

Further, a ratio of the distances from the center of the third sub-pixel and the center of the fourth sub-pixel to the center of the first sub-pixel is (3-2):(2-1). A ratio of the distances from the center of the third sub-pixel and the center of the fourth sub-pixel to the center of the second sub-pixel is also (3-2):(2-1). It may be understood that, in addition to the color edge and the sense of granularity, resolution and uniformity are also the key factors to affect the quality of display. Therefore, by further limiting the ratios of the distances from the centers of the third sub-pixel and the fourth sub-pixel to the centers of the first sub-pixel and the second sub-pixel, the arrangement of the sub-pixels achieves a good balance between uniformity, compactness and dislocation degrees, thereby improving the quality of display comprehensively.

It is to be noted that the center of the sub-pixel may be a geometric center of a graphic of the sub-pixel or a center of a light-emitting color of the sub-pixel, which is not limited herein.

Further, in a same pixel unit, along the first direction and the second direction, a minimum distance between two adjacent sub-pixels is p, and along the first direction and the second direction, a minimum distance between the nearest sub-pixels in different colors in two adjacent pixel units is also p, where 10 μm<p<30 μm. In this way, on the one hand, the sub-pixels are arranged more uniformly, which is conducive to improving the quality of display; on the other hand, the sense of serration produced by light-emitting cross color or interference between adjacent sub-pixels can be effectively prevented. It is to be noted that the display panel according to the embodiment of the present application may be an organic light-emitting display panel, the sub-pixel includes at least an anode, a cathode, and a light-emitting layer between the anode and the cathode, and the driving circuit applies a voltage between the anode and the cathode to excite the migration of carriers and act on the light-emitting layer, so as to emit light. The display panel may further include a PDL. The PDL defines a plurality of pixel openings. The light-emitting layer of the sub-pixel is arranged in the pixel openings to prevent cross color or interference between adjacent sub-pixels. Therefore, an area of the pixel opening is a light-emitting area of the sub-pixel. However, due to the limitations of the vapor deposition technology, in order to ensure that the light-emitting material is completely vapor-deposited into the pixel opening, an opening area of the mask is generally larger than that of the pixel opening, so as to leave a vapor deposition margin. For example, as shown in FIG. 3, an inner side edge of the sub-pixel is called a pixel edge, which is a boundary of the pixel opening of the PDL. An outer side edge is called a virtual edge of the sub-pixel. The virtual edge is a boundary of a vapor deposition opening of the mask. Thus, in the embodiment of the present application, the pitch between the sub-pixels refers to a distance between pixel edges of two sub-pixels. Specific to the embodiments shown in FIG. 3 and FIG. 4, two adjacent sub-pixels have two pixel edges adjacent and parallel to each other, and thus a minimum distance between the two adjacent sub-pixels is a vertical distance between the two pixel edges adjacent and parallel to each other.

Further, a minimum distance between the second sub-pixel in the first pixel unit and the third sub-pixel of the second pixel unit adjacently arranged in the first direction is q, where p<q<3p. In this way, the light-transmitting reserved region can be ensured to have an enough size to meet the amount of light input required for the normal operation of the under-screen photosensitive device.

As shown in FIG. 5, FIG. 6 and FIG. 7, as a preferred implementation, the first sub-pixel, the second sub-pixel, the third sub-pixel, and the fourth sub-pixel may be in the shape of a rectangle or quasi-rectangle, and major-axis directions (extension directions) of the first sub-pixel, the second sub-pixel, the third sub-pixel and the fourth sub-pixel intersect the row direction and the column direction. In this way, on the one hand, compared with other sub-pixel shapes, the sub-pixels can be arranged densely, and the arrangement of the sub-pixels in the same color into an individual row is prevented, which effectively ameliorates the color edge phenomenon. On the other hand, the sub-pixels at irregular edges of the display panel can better match the rounded corner design, that is, the tilt of the sub-pixels is tangent to or consistent with the radian of the rounded corner, so as to realize the smooth transition of the edges of the sub-pixels at the rounded corner, thereby alleviating the problem of serration at the rounded corner. Preferably, extension directions of the first sub-pixel, the second sub-pixel, the third sub-pixel, and the fourth sub-pixel are parallel to the first direction, and at an angle of 30°-60° to the row direction or the column direction. In this way, the tilt of the sub-pixels can be further tangent to or consistent with the radian of the rounded corner, so as to realize the smooth transition of the edges of the sub-pixels at the rounded corner, thereby further alleviating the problem of serration at the rounded corner. It is to be emphasized that the human eyes are sensitive to the quality of pictures in the horizontal or vertical direction, but insensitive to the quality of pictures in a direction at an angle of 45° to the horizontal direction. Therefore, as a preferred implementation, as shown in FIG. 7, an angle between the first direction and the row direction is 45°, so as to further improve the overall quality of display. It is to be particularly noted that the force on the mask is generally transferred along the row or column direction. For example, net tensile force F is transferred along the row direction, and the opening of the mask of the corresponding sub-pixel tilting relative to the row or column direction may decompose the force in the row direction and the column direction, so as to prevent deformation of the opening caused by concentration of the net tensile force F of the FMM and reduce the manufacturing difficulty and the net tension difficulty of the mask. Moreover, with the tilt of the opening of the mask, more openings may be provided in the mask with the same length and width, thereby reducing manufacturing costs of the mask.

Certainly, the first sub-pixels, the second sub-pixels, the third sub-pixels and the fourth sub-pixels may also be in other shapes, which is not limited herein. For example, the first sub-pixels may be in the shape of a square, and the second sub-pixels, the third sub-pixels and the fourth sub-pixels are in the shape of an oblong.

In some embodiments of the present application, a projection of at least one vertex on a common side of the imagined co-sided triangle on an opposite side of the vertex, as a whole, is located between two intersection points of contours of two sub-pixels corresponding to the opposite side of the vertex and the opposite side of the vertex. In other words, an intersection point between a straight line passing through a vertex on a common side of the imagined co-sided triangle and perpendicular to an opposite side of the vertex is located between two intersection points of contours of two sub-pixels corresponding to the opposite side of the vertex and the opposite side of the vertex. Further, in one pixel unit, an extension line or a tangent line of a side edge of the second sub-pixel along its major axis does not intersect whole of the third sub-pixel and/or the fourth sub-pixel. For example, a projection of the sub-pixel corresponding to the vertex of the common side of the imagined co-sided triangle on the opposite side of the vertex may be wholly located between two intersection points of contours of two sub-pixels corresponding to the opposite side of the vertex and the opposite side of the vertex. In this way, the extension line or the tangent line of the side of the second sub-pixel along its major axis may not intersect the whole of the third sub-pixel and/or the fourth sub-pixel. Specific to some embodiments, as shown in FIG. 3 and FIG. 4, two vertices of the common side are the center of the first sub-pixel and the center of the second sub-pixel, respectively. To enable the arrangement of the sub-pixels to be more uniform and reduce the manufacturing difficulty, two adjacent sub-pixels have two pixel edges that are opposite and parallel to each other. For example, the first sub-pixel and the third sub-pixel have two pixel edges that are opposite and parallel to each other. The two pixel edges are contour boundaries of the first sub-pixel and the third sub-pixel. A projection of the second sub-pixel towards the opposite side e, as a whole, is located between two intersection points of the opposite side e and the contours of the first sub-pixel and the second sub-pixel. That is, the projection of the second sub-pixel towards the opposite side e is located between two intersection points of the opposite side e and the two pixel edges that are opposite and parallel to each other of the first sub-pixel and the second sub-pixel. It may be understood that, in the embodiment shown in FIG. 3, the projection of the first sub-pixel towards the opposite side b, as a whole, is not located between the opposite side b and the connecting line between centers of the second sub-pixel and the third sub-pixel, which does not hinder the understanding of the technical concept. In some other embodiments, the projection of the first sub-pixel towards the opposite side b, as a whole, may be located between two intersection points of the opposite side b and two pixel edges that are opposite and parallel to each other of the second sub-pixel and the third sub-pixel. In this way, on the one hand, the sub-pixels are arranged more uniformly, and on the other hand, the dislocation of the sub-pixels further ameliorates the color edge phenomenon.

In a same pixel unit, the first sub-pixel has a first major axis and a first minor axis; the third sub-pixel has a third major axis and a third minor axis; and the fourth sub-pixel has a fourth major axis and a fourth minor axis. That is, each sub-pixel is a regular or irregular graphic with a major axis and a minor axis, such as the rectangle or quasi-rectangle. In this way, on the one hand, compared with other sub-pixel shapes, the sub-pixels can be dislocated densely, and protrusion degrees of the sub-pixels are weakened, which effectively ameliorates the color edge phenomenon. Preferably, the third sub-pixel and the fourth sub-pixel are sub-pixels in the same color, such as green sub-pixels. The third major axis and the fourth major axis are parallel to each other and have equal lengths, and the third minor axis and the fourth minor axis are parallel to each other and have equal lengths. Further, a length ratio of the first major axis to the first minor axis is between 1.5 and 1; a length ratio of the second major maxis to the second minor axis is between 5 and 1; and a length ratio of the third major axis to the third minor axis is between 5 and 1. For example, in the embodiments shown in FIG. 3 and FIG. 4, the first sub-pixel is in the shape of a square, and the length ratio of the first major axis to the first minor axis is 1; the second sub-pixel, the third sub-pixel and the fourth sub-pixel are in the shape of an oblong, and ratios of the major axes to the minor axes of the second sub-pixel, the third sub-pixel and the fourth sub-pixel are 5:1. In this way, on the premise of ensuring the aperture ratio as much as possible, the sub-pixels can be dislocated correspondingly to ameliorate the color edge phenomenon as much as possible. In addition, a light-transmitting reserved region with a larger area can also be formed between adjacent sub-pixels as much as possible to increase a lighting area of the under-screen photosensitive device.

In some embodiments, in the first pixel unit and the second pixel unit adjacent to each other in the first direction, a distance between the second sub-pixel R1 in the first pixel unit and the third sub-pixel G21 in the second pixel unit is greater than distances between the third sub-pixel G11 in the first pixel unit and the second sub-pixel R1 and between the fourth sub-pixel 12 and the second sub-pixel R1. This further ensures that a continuous light-transmitting reserved region Z with an area that can meet the normal operation of the under-screen photosensitive device may be formed in each repetitive unit, so as to improve the light transmittance of the display panel, providing convenience for the diversification of functions of the display panel. As an implementation, an area of the light-transmitting reserved region Z is greater than the light-emitting area of one first sub-pixel R1/R2.

Figure 8:
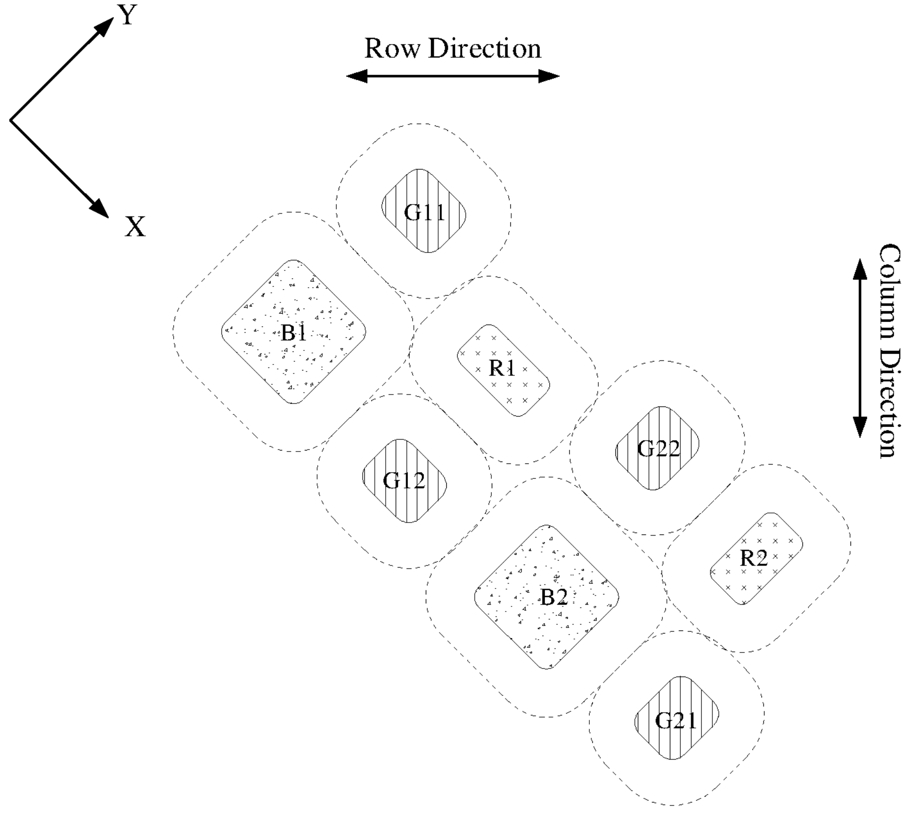
FIG. 8 is a schematic diagram of a pixel arrangement structure according to an embodiment of the present application.

As shown in FIG. 7 and FIG. 8, the pixel arrangement structure includes first sub-pixels, second sub-pixels, third sub-pixels, and fourth sub-pixels. Centers of two of the first sub-pixels arranged opposite to each other and centers of two of the second sub-pixels arranged opposite to each other being taken as vertices and connected to form a virtual quadrilateral. The virtual quadrilateral includes two equal sides arranged opposite to each other, a short side and a long side arranged opposite to each other and connected to vertices of the equal sides. The short side is not parallel to the long side.

The third sub-pixel or the fourth sub-pixel is arranged in the virtual quadrilateral, and the third sub-pixel and the fourth sub-pixel emit light in a same color.

The virtual quadrilateral with the third sub-pixel or the fourth sub-pixel arranged inside is divided into the first virtual quadrilateral with the third sub-pixel and the second virtual quadrilateral with the fourth sub-pixel. The first virtual quadrilateral and the adjacent second virtual quadrilateral share a side.

In the first virtual quadrilateral and the adjacent second virtual quadrilateral, a sum of four inner angles formed with the centers of the first sub-pixels as vertices is equal to 360°, and a sum of four inner angles formed with the centers of the second sub-pixels as vertices is equal to 360°. In this way, pitches and relative positions between the sub-pixels are limited through the angles of the virtual quadrilateral, so that the sub-pixels can be arranged as uniformly as possible, and the sub-pixels can be dislocated, so as to achieve a balance among display uniformity, compactness and amelioration of the color edge.

A length of a first equilong side of the first virtual quadrilateral is not equal to a length of a second equilong side of the second virtual quadrilateral, a length of the short side of the first virtual quadrilateral is equal to a length of the short side of the second virtual quadrilateral, and a length of the long side of the first virtual quadrilateral is equal to a length of the long side of the second virtual quadrilateral.

In a column direction, the first virtual quadrilateral and the second virtual quadrilateral adjacent thereto take the short side or the long side as a common side. In a row direction, the first virtual quadrilateral and an adjacent inverted first virtual quadrilateral take the first equilong side as a common side, and the second virtual quadrilateral and an adjacent inverted second virtual quadrilateral take the second equilong side as a common side.

The pixel arrangement structure includes a virtual polygon formed by four virtual quadrilaterals arranged with shared sides. The four virtual quadrilaterals specifically include a first virtual quadrilateral 30, a second virtual quadrilateral 40, a third virtual quadrilateral 50 obtained by inverting the first virtual quadrilateral 30 and a fourth virtual quadrilateral 60 obtained by inverting the second virtual quadrilateral 40.

The first virtual quadrilateral shares a first equilong side with the third virtual quadrilateral along the row direction, and shares a short side with the second virtual quadrilateral along the column direction. The third virtual quadrilateral shares the long side with the fourth virtual quadrilateral along the column direction, and the fourth virtual quadrilateral shares the second equilong side with the second virtual quadrilateral along the row direction.

The length of the first equilong side is not equal to the length of the second equilong side.

Non-common sides of the first virtual quadrilateral, the second virtual quadrilateral, the third virtual quadrilateral and the fourth virtual quadrilateral form sides of the virtual polygon.

The second sub-pixel is located at the first vertex of each virtual quadrilateral, the first sub-pixel is located at the second vertex of each virtual quadrilateral, the first vertex and the second vertex are arranged alternately and spaced, and the third sub-pixel or the fourth sub-pixel is located inside each virtual quadrilateral.

In the virtual quadrilateral, a connecting line of centers of two first sub-pixels is taken as a first diagonal, and a connecting line of centers of two second sub-pixels is taken as a second diagonal, and in the virtual quadrilateral, the center of the third sub-pixel and/or the center of the fourth sub-pixel deviate/deviates from the second diagonal.

Further, any side of each of the virtual quadrilaterals is not parallel to the row or column direction; or any two sides of each of the virtual quadrilaterals are not parallel to each other; or any two inner angles of each of the virtual quadrilaterals are not equal. In this way, the first virtual quadrilateral, the second virtual quadrilateral, the third virtual quadrilateral and the fourth virtual quadrilateral are all irregular quadrilaterals, so that a large light-transmitting region may be formed on the premise of meeting compact arrangement of the sub-pixels, thereby further improving the light transmittance of the display panel and providing the convenience for the diversification of functions of the display panel.

As shown in FIG. 3 and FIG. 4, in one pixel unit, the second sub-pixel 14 has a first edge and a second edge opposite to the third sub-pixel 16*a* and the fourth sub-pixel 16*b* respectively, a third edge adjacent to the first edge and opposite to the second edge, and a fourth edge opposite to the first edge and connected to the second edge and the third edge. Extension lines of the second edge and the fourth edge are staggered with the third sub-pixel 16*a*, and extension lines of the first edge and the fourth edge are staggered with the fourth sub-pixel 16*b*. That is, the third sub-pixel 16*a* and the fourth sub-pixel 16*b* are located between extension lines of corresponding edges of the second sub-pixel 14. In this way, compact arrangement of the sub-pixels is ensured as much as possible, protrusion degrees of the sub-pixels of the display edge are weakened, and the color edge problem of the display edge is effectively alleviated.

A connecting line between the centers of the third sub-pixels in a same row and/or column is a non-straight line, and a connecting line between the centers of the fourth sub-pixels in a same row and/or column is a non-straight line. For example, as shown in FIG. 5, FIG. 6 and FIG. 8, a connecting line between the centers of the green sub-pixels in a same row and/or column is zigzag. Connecting lines between centers of two green sub-pixels in any pixel group of odd-numbered rows or columns and two nearest green sub-pixels in a pixel group of even-numbered rows or columns adjacent thereto form a fifth virtual quadrilateral. A minimum inner angle in the fifth virtual quadrilateral is $\gamma \geq 60°$. In this way, the green sub-pixels in the adjacent pixel groups are not too close, so as to further prevent visual integration of two adjacent green sub-pixels by the human eyes caused by difficult distinction between two adjacent green sub-pixels due to a short distance between the adjacent green sub-pixels.

It may be understood that, in some embodiments, a connecting line between the centers of the first sub-pixels in a same row or column may be a straight line, and a connecting line between the centers of the second sub-pixels in a same row or column may be a straight line. In this way, the sub-pixels may be arranged more uniformly, which helps improve the quality of display.

A display panel is further provided in the second aspect of the present application, including the pixel arrangement structure in the above embodiment.

Referring to FIG. 3 to FIG. 7 together with FIG. 8, the pixel arrangement structure according to the present application further includes the following features.

The pixel arrangement structure according to the present application includes a first sub-pixel 12, a second sub-pixel 14, a third sub-pixel 16*a*, and a fourth sub-pixel 16*b*. The first sub-pixel 12, the second sub-pixel 14, the third sub-pixel 16*a*, and the fourth sub-pixel 16*b* may be one of blue sub-pixels, red sub-pixels and green sub-pixels, respectively. Certainly, in some other embodiments, the first sub-pixel 12, the second sub-pixel 14, the third sub-pixel 16*a*, and the fourth sub-pixel 16*b* may also be sub-pixels that emit light in other colors in addition to blue, red and green. For example, the third sub-pixel Ida or the fourth sub-pixel 16*b* may be a white or yellow sub-pixel, which is not limited herein. It is to be understood that light in different colors has different wavelengths. The shorter the wavelength, the higher the energy of light. High-energy light easily causes the decay of the organic light-emitting material, so that sub-pixels that emit high-energy photons decay more easily. Blue light has a shorter wavelength than red light and green light, so the blue light has higher energy, and the organic light-emitting materials that emit blue light are more prone to decay. As a result, light emitted from the pixel unit tends to be reddish, resulting in white light color cast. Moreover, light emitted by each sub-pixel is repeatedly reflected and re-reflected between an anode and a cathode through a Fabry-Perot microcavity effect for amplification and constructive interference. The brightness of the light is increased, and the color cast is further amplified. As a preferred implementation, as shown in FIG. 3, the first sub-pixel 12 is a blue sub-pixel, the second sub-pixel 14 is a red sub-pixel, and the third sub-pixel 16*a* and the fourth sub-pixel 16*b* are green sub-pixels. The blue sub-pixel has a larger light-emitting area than the red sub-pixel and the green sub-pixel. In this way, poor display caused by different decay rates of organic light-emitting materials emitting light in different colors can be reduced to some extent. It is to be noted that, in some implementations, the light-emitting area of the green sub-pixel may be equal to that of the red sub-pixel. However, since the human eyes are more sensitive to the green light than the red light, in some other implementations, the light-emitting area of the green sub-pixel may be smaller than that of the red sub-pixel, which is not limited herein.

Centers of two first sub-pixels 12 arranged opposite to each other and centers of two second sub-pixels 14 arrange opposite to each other are taken as vertices and connected to form a virtual quadrilateral. That is, the centers of the two first sub-pixels 12 are taken as a set of diagonal vertices of the virtual quadrilateral, and the centers of the two second sub-pixels 14 are taken as the other set of diagonal vertices of the virtual quadrilateral. For example, as shown in FIG. 7, in the first virtual quadrilateral 30, two first sub-pixels are arranged along the second direction, two second sub-pixels are arranged along the first direction, and centers of the two first sub-pixels and centers of the two second sub-pixels are sequentially connected to form the virtual quadrilateral. The first virtual quadrilateral includes two equal sides arranged opposite to each other, a short side and a long side arranged opposite to each other and connected to vertices of the equal sides. Still referring to FIG. 7, in the first virtual quadrilateral 30, along the column direction, a connecting line between centers of one first sub-pixel 12 and one second sub-pixel 14 is the first equilong opposite side, and a connecting line between centers of the other first sub-pixel 12 and the other second sub-pixel 14 is the second equilong opposite side. Along the row direction, a connecting line between centers of one first sub-pixel 12 and one second sub-pixel 14 is the long side of the virtual quadrilateral, and a connecting line between centers of the other first sub-pixel 12 and the other second sub-pixel 14 is the short side of the virtual quadrilateral.

One third sub-pixel or one fourth sub-pixel is arranged in the virtual quadrilateral, and the third sub-pixel and the fourth sub-pixel emit light in a same color. Specifically, the pixel arrangement structure includes four virtual quadrilaterals. The four virtual quadrilaterals include a first virtual quadrilateral and a second virtual quadrilateral adjacent and co-sided. The first virtual quadrilateral is provided with one of the third sub-pixels, and the second virtual quadrilateral is provided with one of the fourth sub-pixels. Specific to the embodiment shown in FIG. 7, the four virtual quadrilaterals are arranged with shared sides. The four virtual quadrilaterals specifically include a first virtual quadrilateral 30, a second virtual quadrilateral 40, a third virtual quadrilateral 50 obtained by inverting the first virtual quadrilateral 30 and a fourth virtual quadrilateral 60 obtained by inverting the second virtual quadrilateral 40. The first virtual quadrilateral 30 shares a first shared side g with the third virtual quadrilateral 50 along the row direction, and shares a second shared side h with the second virtual quadrilateral 40 along the column direction. The fourth virtual quadrilateral 60 shares a third shared side j with the third virtual quadrilateral 50 along the column direction, and the fourth virtual quadrilateral 60 shares a fourth shared side i with the second virtual quadrilateral 40 along the row direction. Sides of the virtual quadrilaterals away from the shared sides form sides of the virtual polygon. The second sub-pixel 14 is located at the first vertex of each virtual quadrilateral, the first sub-pixel 12 is located at the second vertex of each virtual quadrilateral, and the first vertex and the second vertex are arranged alternately and spaced. The first virtual quadrilateral 30 and the second virtual quadrilateral 40 are provided with one third sub-pixel 16*a*, and the third virtual quadrilateral 50 and the fourth virtual quadrilateral 60 are provided with one third sub-pixel 16*b*.

The short side of the virtual quadrilateral is not parallel to the long side of the virtual quadrilateral. It may be understood that the pixel arrangement structure directly determines the display effect. In order to ensure the uniformity of display, in the pixel arrangement structure shown in FIG. 1, the sub-pixels may generally be arranged as uniformly as possible along the row direction and the column direction according to certain rules, but the existing pixel arrangement structure is also prone to color cast and a color edge. With the pixel arrangement structure, the virtual quadrilateral has a set of equilong opposite sides, and a long side and a short sides with different lengths, and the long sides are not parallel to the short sides, so that the sub-pixels can be dislocated, and the arrangement uniformity, compactness of and pitches between the sub-pixels can be taken into account to seek a balance among the three, which is conducive to reducing the color mixing risk and ameliorating the color edge and marginal serration. For example, when the display matrix is formed, the sub-pixels are staggered due to the above restrictions, so as to prevent arrangement of the sub-pixels emitting light in a same color into an individual column, which alleviates the color edge problem of the display edge. Moreover, the staggered sub-pixels enable the sub-pixels at a rounded corner of the display panel to better match the rounded corner design. That is, smooth transition of a line of edges of the sub-pixels at the rounded corner is tangent to or consistent with a radian of the rounded corner, so as to alleviate the problem of serration at the rounded corner. In addition, the third sub-pixel and the fourth sub-pixel may be set as green sub-pixels to which the human eyes are sensitive, surrounded by blue and red sub-pixels, so as to make the color mixing more uniform and prevent color cast.

In some embodiments, in the first virtual quadrilateral and the adjacent second virtual quadrilateral, a sum of four inner angles formed with the centers of the first sub-pixels as vertices is equal to 360°, and a sum of four inner angles formed with the centers of the second sub-pixels as vertices is equal to 360°. In this way, pitches and relative positions between the sub-pixels are limited through the angles of the virtual quadrilateral, so that the sub-pixels can be arranged as uniformly as possible, and the sub-pixels can be dislocated, so as to achieve a balance among display uniformity, compactness and amelioration of the color edge.

Further, a length of a first equilong opposite side of the first virtual quadrilateral is not equal to a length of a second equilong opposite side of the second virtual quadrilateral; a length of the short side of the first virtual quadrilateral is equal to a length of the short side of the second virtual quadrilateral; and a length of the long side of the first virtual quadrilateral is equal to a length of the long side of the second virtual quadrilateral. In this way, when the display matrix is formed, the sub-pixels can be arranged compactly, and the sub-pixels can keep a more uniform and regular arrangement, which is conducive to the improvement of the quality of display. Specifically, in a column direction, the first virtual quadrilateral and the second virtual quadrilateral adjacent thereto take the short side or the long side as a common side. Specific to the embodiment shown in FIG. 7, in the row direction, the first virtual quadrilateral 30 is inverted with the adjacent third virtual quadrilateral 50, and the first equilong opposite side is taken as a common side. The second virtual quadrilateral 40 is inverted with the adjacent fourth virtual quadrilateral 60, and the second equilong opposite side is taken as a common side. In the column direction, the virtual quadrilateral 30 shares the short side with the adjacent virtual quadrilateral 40, and the third virtual quadrilateral 50 shares the long side with the adjacent fourth virtual quadrilateral 60. That is, adjacent first virtual quadrilaterals or second virtual quadrilaterals flipped by 180 degrees along a preset angle have a same structure. In this way, when the display matrix is formed, on the one hand, the sub-pixels are arranged compactly; on the other hand, the arrangement of the sub-pixels is regular and the repetitive unit is closer to a regular graphic on the whole, which is conducive to the improvement of the quality of display. Furthermore, protrusion degrees of the sub-pixels can be weakened, and the color edge is effectively ameliorated.

It may be understood that, in some other embodiments, the length of the first equilong opposite side may also be equal to the length of the second equilong opposite side, which is not limited herein. In the embodiment of the present application, the dislocation of the sub-pixels is further strengthened, which is beneficial to ameliorate the color edge.

In the embodiment of the present application, the pixel structure includes first pixel units and second pixel units, the first pixel units and the second pixel units are adjacent to each other, and the plurality of first pixel units and the plurality of second pixel units are alternately arranged in a first direction and a second direction. For example, as shown in FIG. 7 and FIG. 8, in the first direction, the first pixel units and the second pixel units are alternately arranged. In the second direction, the first pixel units and the second pixel units are alternately arranged. That is, in the first direction and the second direction, any two adjacent first pixel units are separated by one second pixel unit, and any two adjacent second pixel units are separated by one first pixel unit. Further, sub-pixel structures of the first pixel unit and the second pixel unit are mirror-symmetrical after rotating one of the pixel units by 90°. That is, the sub-pixels in the first pixel unit and the sub-pixels in the same color in the second pixel unit are the same in shape and size (light-emitting area). The sub-pixel structures after the sub-pixels in the second pixel unit are rotated clockwise or counterclockwise by a predetermined angle are mirror-symmetrical to the corresponding sub-pixel structures of the first pixel unit. The predetermined angle is greater than 0° and less than 360°. For example, sub-pixel arrangement structures of the second pixel unit shown in FIG. 4 are mirror-symmetrical to sub-pixel arrangement structures of the first pixel unit shown in FIG. 3 after being rotated by 90° along the first direction. In this way, arrangement of the sub-pixels emitting color in a same color into an individual column in the row direction or the column direction is prevented, and protrusion degrees of the sub-pixels in a same row or column are weakened, thereby effectively alleviating the color edge problem of the display edge. The color cast may also be effectively ameliorated at the same time. For example, the third sub-pixel and the fourth sub-pixel may be set as sub-pixels to which the human eyes are sensitive, such as green sub-pixels. Each green sub-pixel may be surrounded by red sub-pixels and blue sub-pixels, so that the color mixing is more uniform and the color cast is ameliorated. In addition, the sub-pixel structures in the second pixel unit are mirror-symmetrical to the sub-pixel structures of the first pixel unit after being rotated by a predetermined angle, and a light-transmitting reserved region Z (see FIG. 7) with a large area can be formed between adjacent pixel units as much as possible, which is conducive to increasing a lighting area of the under-screen photosensitive device. It may be understood that, in some other embodiments, the sub-pixel structures of the first pixel unit and the second pixel unit may also be the same, which is not limited herein. That is, a minimum repetitive unit in the pixel arrangement structure is a pixel unit.

In each pixel unit, two imagined acute triangles co-sided but not overlapping are formed with the centers of the first sub-pixel 12, the second sub-pixel 14, the third sub-pixel 16*a* and the fourth sub-pixel 16*b* as vertices, and the center of the first sub-pixel 12 and the center of the second sub-pixel 14 are taken as co-sided vertices of the imagined co-sided triangle. Specifically, as shown in FIG. 3 and FIG. 4, the first sub-pixel 12 is located at one side of a connecting line c between the centers of the third sub-pixel 16*a* and the fourth sub-pixel 16*b*, and the second sub-pixel 14 is located at the other side of the connecting line c between the centers of the third sub-pixel 16*a* and the fourth sub-pixel 16*b*. The centers of the first sub-pixel 12, the second sub-pixel 14, the third sub-pixel 16*a*, and the fourth sub-pixel 16*b* are sequentially connected to form a virtual quadrilateral. Centers of the second sub-pixel 12, the first sub-pixel 14 and the third sub-pixel 16*a* are connected to form a first triangle (not shown). The centers of the second sub-pixel 12, the first sub-pixel 14 and the fourth sub-pixel 16*b* are connected to form a second triangle. The first triangle and the second triangle take a connecting line d between the center of the first sub-pixel 12 and the center of the second sub-pixel 14 as a common side, and areas of the two triangles do not overlap with each other.

Along a direction perpendicular to the connecting line between the centers of the first sub-pixel 12 and the third sub-pixel 16*a*, the second sub-pixel 14 and the third sub-pixel 16*a* are not arranged in a same row. That is, along a direction perpendicular to the connecting line between the centers of the first sub-pixel 12 and the third sub-pixel 16*a*, the second sub-pixel 14 and the third sub-pixel 16*a* are staggered. In other words, in the virtual quadrilateral, a connecting line of centers of two first sub-pixels is taken as a first diagonal, and a connecting line of centers of two second sub-pixels is taken as a second diagonal, and in the virtual quadrilateral, the center of the third sub-pixel and/or the center of the fourth sub-pixel deviate/deviates from the second diagonal. Specific to embodiments, the first sub-pixel 12 and the third sub-pixel 16*a* are arranged along the second direction Y perpendicular to the first direction, and along a direction perpendicular to the connecting line between the centers of the first sub-pixel 12 and the third sub-pixel 16*a*, that is, the first direction X, the second sub-pixel 14 and the third sub-pixel 16*a* are staggered. Vertices of the virtual quadrilateral are respectively arranged in the center of the first sub-pixel and the center of the second sub-pixel in the first pixel unit and the centers of the first sub-pixels or the centers of the second sub-pixels in the two second pixel units adjacent to the first pixel unit; or vertices of the virtual quadrilateral are respectively arranged in the center of the first sub-pixel and the center of the second sub-pixel in the second pixel unit and the centers of the first sub-pixels or the centers of the second sub-pixels in the two first pixel units adjacent to the second pixel unit. In this way, arrangement of the sub-pixels emitting color in a same color into an individual column in the row direction or the column direction is prevented, and protrusion degrees of the sub-pixels in a same row or column are weakened, thereby effectively alleviating the color edge problem of the display edge.

It is worth emphasizing that an amount of light input and contrast of light signals received by the under-screen photosensitive device may affect the quality of the generated image of the object. Although the display panel with other pixel arrangement structures has more light-transmitting regions so that an overall light-transmitting area has no difference, a continuous light-transmitting region in a specific region has a small area, which cannot meet the light transmittance required by the normal operation of the under-screen photosensitive device. Since the second sub-pixel 14 and the third sub-pixel 16*a* are staggered, a light-transmitting reserved region is formed at the outer side of the second sub-pixel 14, which is conducive to the realization of the manufacturing of a display screen such as an under-screen camera. Specifically, as shown in FIG. 7 and FIG. 8, the blank region adjacent to the second sub-pixel R1/R2 is the light-transmitting reserved region. Specific to one embodiment, the light-transmitting reserved region has a size ranging from 10 μm to 90 μm in the first direction, and has a size ranging from 20 μm to 90 μm in the second direction.

In a same pixel unit, along a direction perpendicular to the connecting line between the centers of the first sub-pixel 12 and the third sub-pixel 16*a*, the second sub-pixel 12 and the second sub-pixel 14 are not arranged in a same row. That is, along a direction perpendicular to the connecting line between the centers of the first sub-pixel 12 and the third sub-pixel 16*a*, the second sub-pixel 14 and the first sub-pixel 12 are also staggered. Further, a projection of the center of the second sub-pixel 14 that is a vertex of the common side of the imagined co-sided triangle on an opposite side opposite to the vertex is on the opposite side, and the projection does not overlap with the center of the third sub-pixel 16*a* and the center of the first sub-pixel 12. For example, as shown in FIG. 7, a projection of the center of the second sub-pixel 14 (one vertex of the connecting line d of centers) on an opposite side e opposite thereto (a connecting line between the center of the first sub-pixel 12 and the center of the third sub-pixel 16*a*) is on the opposite side e. Moreover, the projection is located between the center of the first sub-pixel 12 and the center of the third sub-pixel 16*a*, that is, does not overlap with the center of the third sub-pixel 16*a*. In this way, the complete dislocation between the sub-pixels is ensured, the arrangement of the sub-pixels in the same color into an individual row is further prevented, and the protrusion of the sub-pixels is weakened, thereby preventing the color edge phenomenon and helping improve the quality of display.

It is to be noted that the projection of the vertex of the common side on the opposite side refers to a projection of the vertex on the opposite side along a direction perpendicular to the opposite side of the vertex. That is, an intersection point between a perpendicular line passing through the vertex and perpendicular to the opposite side of the vertex and the opposite side is the projection of the vertex on the opposite side. For example, as shown in FIG. 7, one vertex of a common side d of the first triangle and the second triangle is the center of the second sub-pixel 14, and an intersection point between a perpendicular line passing through the center of the second sub-pixel 14 and perpendicular to an opposite side e opposite thereto and the opposite side e is the projection of the vertex on the opposite side opposite thereto.

As shown in FIG. 3 and FIG. 4, in a same pixel unit, a connecting line e between centers of the first sub-pixel 12 and the second sub-pixel 14 intersects but is not perpendicular to a connecting line c between centers of the third sub-pixel 16*a* and the fourth sub-pixel 16*b*. It is easy to understand that connecting lines between centers of the first sub-pixel 12, the second sub-pixel 14, the third sub-pixel 16 and the fourth sub-pixel 16*b* form a virtual quadrilateral, and a connecting line c between the centers of the first sub-pixel 12 and the second sub-pixel 14 and a connecting line d between the centers of the third sub-pixel 16*a* and the fourth sub-pixel 16*b* are diagonals of the virtual quadrilateral. Since the second sub-pixel 14 and the third sub-pixel 16*a* are staggered in the first direction and the diagonals of the virtual quadrilateral are not perpendicular to each other, the sub-pixels in the pixel unit can be arranged densely, and the degree of dislocation is strengthened, which further weakens the color edge of display. As a preferred implementation, the first sub-pixels 12 and the second sub-pixels 14 may be blue sub-pixels and red sub-pixels respectively, and the third sub-pixels 16*a* and the fourth sub-pixels 16*b* may be green sub-pixels. The green sub-pixels have a smaller light-emitting area than the blue sub-pixels. In a same pixel unit, a connecting line d between the center of the first sub-pixel 12 and the center of the second sub-pixel 14 and a connecting line c between the center of the third sub-pixel 16*a* and the center of the fourth sub-pixel 16*b* are not equal in length. It is easy to understand that sub-pixels emitting light in different colors generally have different light-emitting areas. For example, the blue sub-pixels have larger light-emitting areas than the red sub-pixels and the green sub-pixels. By designing the length of the connecting line d of centers to be unequal to that of the connecting line c of centers, the pitch between the first sub-pixel 12 and the second sub-pixel 14 and the pitch between the third sub-pixel 16*a* and the fourth sub-pixel 16*b* can be guaranteed to meet preset conditions to arrange the sub-pixels as dense as possible and improve distribution uniformity of the sub-pixels in sensitive colors, which improves visual resolution and enhances the quality of display.

As shown in FIG. 3 and FIG. 4, in a same pixel unit, a length of a connecting line e between the center of the first sub-pixel 12 and the center of the third sub-pixel 16*a* is not equal to a length a of a connecting line between the center of the first sub-pixel 12 and the center of the fourth sub-pixel 16*b* in the same pixel unit. Specific to one embodiment, the first sub-pixel 12 is a blue sub-pixel, the second sub-pixel 14 is a red sub-pixel, and the third sub-pixel 16*a* and the fourth sub-pixel 16*b* are green sub-pixels. Connecting lines between centers of the blue sub-pixel and different green sub-pixels in a same pixel unit are not equal in length. In some other embodiments, in one pixel unit, distances from the center of the third sub-pixel 16*a* and the center of the fourth sub-pixel 16*b* to the center of the second sub-pixel 14 are not equal. In this way, on the one hand, adjacent sub-pixels are not too close, so as to further prevent visual integration of two adjacent sub-pixels in the same color by the human eyes caused by difficult distinction between two adjacent sub-pixels in the same color due to a short distance between the adjacent sub-pixels. On the other hand, by setting the lengths of the connecting lines between the centers of the first sub-pixel 12 and the second sub-pixel 14 and the centers of the third sub-pixel 16*a* and the fourth sub-pixel 16*b* to be different, the dislocation of the sub-pixels is strengthened, so that, when the first pixel unit and the second pixel unit are repeatedly arranged to form a display matrix, arrangement of the sub-pixels in the same color into an individual column can be further prevented, and protrusion degrees of the sub-pixels in the same row or column are weakened, thereby alleviating the color edge problem of the display edge.

In a same pixel unit, a ratio of the distances from the center of the third sub-pixel 16*a* and the center of the fourth sub-pixel 16*b* to the center of the first sub-pixel 12 is (3-2):(2-1). A ratio of the distances from the center of the third sub-pixel 16*a* and the center of the fourth sub-pixel 16*b* to the center of the second sub-pixel 14 is also (3-2):(2-1). It may be understood that, in addition to the color edge and the sense of granularity, resolution and uniformity are also the key factors to affect the quality of display. Therefore, by further limiting the ratios of the distances from the centers of the third sub-pixel 16*a* and the fourth sub-pixel 16*b* to the centers of the first sub-pixel 12 and the second sub-pixel 14, the arrangement of the sub-pixels achieves a good balance between uniformity, compactness and dislocation degrees, thereby improving the quality of display comprehensively. It is to be noted that the center of the sub-pixel may be a geometric center of a graphic of the sub-pixel or a center of a light-emitting color of the sub-pixel, which is not limited herein.

In an example, light-emitting areas of the third sub-pixel 16*a* and the fourth sub-pixel 16*b* may be equal. For example, the third sub-pixel 16*a* and the fourth sub-pixel 16*b* may be set as sub-pixels in a color to which the human eyes are sensitive, so that the display can be more uniform while the resolution is improved as much as possible. Further, light-emitting areas of the first sub-pixel 12, the third sub-pixel 16*a* and the fourth sub-pixel 16*b* may also be equal. In this way, the arrangement of the sub-pixels is more compact and uniform as a whole, and the display effect is improved. As a preferred implementation, the first sub-pixel 12, the second sub-pixel 14, the third sub-pixel 16*a* and the fourth sub-pixel 16*b* may be in the shape of a rectangle or quasi-rectangle, and the major-axis direction of the second sub-pixel 14 is parallel to a direction perpendicular to the connecting line between centers of the first sub-pixel 12 and the third sub-pixel 16*a*. Specifically, as shown in FIG. 3 and FIG. 7, the major-axis direction of the second sub-pixel 14 is parallel to the first direction, the direction of the connecting line between centers of the first sub-pixel 12 and the third sub-pixel 16*a* is parallel to the second direction, and the first direction is perpendicular to the second direction. In this way, on the one hand, compared with other sub-pixel shapes, the sub-pixels can be arranged densely, and the arrangement of the sub-pixels in the same color into an individual row is prevented, which effectively ameliorates the color edge phenomenon. On the other hand, the sub-pixels at irregular edges of the display panel can better match the rounded corner design, that is, the tilt of the sub-pixels is tangent to or consistent with the radian of the rounded corner, so as to realize the smooth transition of the edges of the sub-pixels at the rounded corner, thereby alleviating the problem of serration at the rounded corner.

Preferably, extension directions of the first sub-pixel 12, the second sub-pixel 14, the third sub-pixel 16*a*, and the fourth sub-pixel 16*b* are parallel to the first direction, and at an angle of 30°-60° to the row direction or the column direction. In this way, the tilt of the sub-pixels can be further tangent to or consistent with the radian of the rounded corner, so as to realize the smooth transition of the edges of the sub-pixels at the rounded corner, thereby further alleviating the problem of serration at the rounded corner. It is to be emphasized that the human eyes are sensitive to the quality of pictures in the horizontal or vertical direction, but insensitive to the quality of pictures in a direction at an angle of 45° to the horizontal direction. Therefore, as a preferred implementation, an angle between the first direction and the row direction is 45°, so as to further improve the overall quality of display. It is to be particularly noted that the force on the mask is generally transferred along the row or column direction. For example, net tensile force F is transferred along the row direction, and the opening of the mask of the corresponding sub-pixel tilting relative to the row or column direction may decompose the force in the row direction and the column direction, so as to prevent deformation of the opening caused by concentration of the net tensile force F of the FMM and reduce the manufacturing difficulty and the net tension difficulty of the mask. Moreover, with the tilt of the opening of the mask, more openings may be provided in the mask with the same length and width, thereby reducing manufacturing costs of the mask.

Certainly, the first sub-pixels 12, the second sub-pixels 14, the third sub-pixels 16*a* and the fourth sub-pixels 16*b* may also be in other shapes, which is not limited herein. For example, as shown in FIG. 3 and FIG. 7, the first sub-pixels 12 may be in the shape of a square, and the second sub-pixels 14, the third sub-pixels 16*a* and the fourth sub-pixels 16*b* are in the shape of an oblong.

It is to be noted that the quasi-rectangle means that due to technical limitations or for the convenience of mask manufacturing, the shape of the sub-pixels may not be strictly rectangular, but roughly rectangular, for example, a rounded rectangle with rounded corners or a chamfer rectangle. The rounded rectangle is a shape formed when top corners of a rectangle are rounded. The chamfer rectangle is a shape formed when one or more of the top corners of a rectangle is/are cut off. By setting the shape of the sub-pixel as a quasi-rectangle, an aperture ratio of the sub-pixel can be adjusted more flexibly, and restriction conditions on the manufacturing of the mask can be met.

In a same pixel unit, the first sub-pixel 12 has a first major axis and a first minor axis; the second sub-pixel 14 has a second major axis and a second minor axis; the third sub-pixel 16*a* has a third major axis and a third minor axis; and the fourth sub-pixel 16*b* has a fourth major axis and a fourth minor axis. That is, each sub-pixel is a regular or irregular graphic with a major axis and a minor axis, such as the rectangle or quasi-rectangle. Preferably, the third sub-pixel 16*a* and the fourth sub-pixel 16*b* are sub-pixels in the same color, such as green sub-pixels. The third major axis and the fourth major axis are parallel to each other and have equal lengths, and the third minor axis and the fourth minor axis are parallel to each other and have equal lengths. Further, a length ratio of the first major axis to the first minor axis is between 1.5 and 1; a length ratio of the second major maxis to the second minor axis is between 5 and 1; and a length ratio of the third major axis to the third minor axis is between 5 and 1. For example, in the embodiments shown in FIG. 3 and FIG. 4, the first sub-pixel 12 is in the shape of a square, and the length ratio of the first major axis to the first minor axis is 1; the second sub-pixel 14, the third sub-pixel 16*a* and the fourth sub-pixel 16*b* are in the shape of an oblong, and ratios of the major axes to the minor axes of the second sub-pixel 14, the third sub-pixel 16*a* and the fourth sub-pixel 16*b* are 5:1. In this way, on the premise of ensuring the aperture ratio as much as possible, the sub-pixels can be dislocated correspondingly to ameliorate the color edge phenomenon as much as possible. In addition, a light-transmitting reserved region Z with a larger area can also be formed between adjacent sub-pixels as much as possible to increase a lighting area of the under-screen photosensitive device.

It is to be noted that the length of the major axis of the sub-pixel refers to a maximum size of the light-emitting region of the sub-pixel in a longitudinal extension direction, and the length of the minor axis of the sub-pixel refers to a maximum size of the light-emitting region of the sub-pixel in a width direction opposite to the longitudinal extension direction of the light-emitting region.

The first major axis, the second major axis, the third major axis and the fourth major axis are parallel with each other. Specifically, along the major-axis directions of the sub-pixels, the first sub-pixel 12, the second sub-pixel 14, the third sub-pixel 16*a* and the fourth sub-pixel 16*b* each have a set of opposite edges. Such sets of opposite edges are parallel to one another. Along the minor-axis directions of the sub-pixels, the first sub-pixel 12, the second sub-pixel 14, the third sub-pixel 16*a* and the fourth sub-pixel 16*b* each have the other set of opposite edges. Such sets of opposite edges are parallel to one another. For example, in the embodiments shown in FIG. 3 and FIG. 7, the first sub-pixel 12 is in the shape of a square, and the second sub-pixel 14, the third sub-pixel 16*a* and the fourth sub-pixel 16*b* are in the shape of a rectangle, a length ratio of the first major axis to the first minor axis of the first sub-pixel 12 is 1, and the first major axis, the second major axis, the third major axis and the fourth major axis are parallel with each other. The first sub-pixel 12 has a first edge and a second edge opposite to the third sub-pixel 16*a* and the fourth sub-pixel 16*b* respectively, a third edge adjacent to the first edge and opposite to the second edge, and a fourth edge opposite to the first edge and connected to the second edge and the third edge. The first edge and the fourth edge of the first sub-pixel 12 are parallel to the long edge of the second sub-pixel 12, and are parallel to the long edges of the third sub-pixel 16*a* and the fourth sub-pixel 16*b*. This helps arrange the sub-pixels uniformly, thereby improving the quality of display.

In a pixel unit, an extension line of one edge of the first sub-pixel 12 near a margin of the pixel unit overlaps with an extension line of a short edge of the third sub-pixel 16*a* near the same margin of the pixel unit. An extension line of the other edge of the first sub-pixel 12 near the edge of the pixel unit overlaps with an extension line of a long edge of the fourth sub-pixel 16*b* near the same margin of the pixel unit. Specific to an embodiment, in one pixel unit, the third edge of the first sub-pixel 12 may be collinear with the short edge of the third sub-pixel 16*a*, and the fourth edge of the first sub-pixel 12 may be collinear with the long edge of the fourth sub-pixel 16*b*. In this way, the first pixel units are ensured to have a regular shape as much as possible, so that the arrangement of the sub-pixels is more compact and uniform. Further, in some embodiments, an extension line of the second edge of the first sub-pixel 12 is staggered with the third sub-pixel 16*a*, and the extension line of the first edge is staggered with the fourth sub-pixel 16*b*. In this way, degrees of dislocation between the sub-pixels are ensured, protrusion degrees of the sub-pixels of the display edge are weakened, and the color edge problem of the display edge is effectively alleviated.

Further, in some embodiments, lengths of the long edges of the first sub-pixel 12, the third sub-pixel 16*a* and the fourth sub-pixel 16*b* may also be equal to an edge length of the second sub-pixel 14. In this way, the first pixel unit is further ensured to have a regular shape, so that the arrangement of sub-pixels is more compact and uniform.

An extension line of at least one of the two long edges of the second sub-pixel 14 passes through a gap between the first sub-pixel 12 and the third sub-pixel 16*a*. Further, an extension line of one long edge of the second sub-pixel 14 passes through the gap between the first sub-pixel 12 and the third sub-pixel 16*a*, and the extension line of the other long edge of the second sub-pixel 14 overlaps with the edge of the first sub-pixel 12 near the third sub-pixel 16*a*. For example, an extension line of one long edge of the second sub-pixel 14 passes between the first sub-pixel 12 and the third sub-pixel 16*a*. An extension line of the other long edge of the second sub-pixel 14 is collinear with the first edge of the first sub-pixel 12. In this way, on the premise of uniform arrangement of the sub-pixels, the size of the light-transmitting reserved region is guaranteed as much as possible, which is conducive to the realization of, for example, under-screen camera functions. Certainly, in some other embodiments, the extension lines of the two long edges of the second sub-pixel 14 pass through the gap between the first sub-pixel 12 and the third sub-pixel 16*a*. That is, the second sub-pixel 14 can be translated along the first direction to pass between the first sub-pixel 12 and the third sub-pixel 16*a*.

A connecting line between the centers of the third sub-pixels 16*a* in a same row and/or column is a non-straight line or a substantially straight line, and a connecting line between the centers of the fourth sub-pixels 16*b* in a same row and/or column is a non-straight line or a substantially straight line. For example, as shown in FIG. 7 and FIG. 8, a connecting line between the centers of the green sub-pixels in a same row and/or column may be zigzag. In this way, on the one hand, the protrusion degrees of the sub-pixels are weakened, and the color edge is ameliorated; on the other hand, the green sub-pixels in the adjacent pixel groups are not too close, so as to further prevent visual integration of two adjacent green sub-pixels by the human eyes caused by difficult distinction between two adjacent green sub-pixels due to a short distance between the adjacent green sub-pixels.

It may be understood that, in some embodiments, a connecting line between the centers of the first sub-pixels in a same row and/or column may be a straight line, and a connecting line between the centers of the second sub-pixels 14 in a same row and/or column may be a straight line. In this way, the sub-pixels may be arranged more uniformly, which helps improve the quality of display.

Further, along the first direction and the second direction, adjacent third sub-pixels 16*a* and fourth sub-pixels 16*b* arranged in a same row have different major-axis directions. For example, as shown in FIG. 4, the first direction and the second direction are directions inclined to a horizontal row direction and a vertical column direction. Along the first direction and the second direction, the major-axis directions of the two adjacent second sub-pixels R1 and R2 arranged in a same row are opposite to each other. Correspondingly, adjacent third sub-pixels 16*a* and fourth sub-pixels 16*b* arranged along the first direction and the second direction also have different major-axis directions. In this way, on the one hand, the sub-pixels are arranged as dense as possible, the dislocation of the sub-pixels is strengthened, and the color cast is effectively ameliorated. On the other hand, the sense of granularity caused by identification as one by the human eyes due to an excessively short distance between the sub-pixels in the same color is prevented.

The center of the third sub-pixel 16*a* or the center of the fourth sub-pixel 16*b* in the first pixel unit is located at an outer side of a connecting line between the center of the second sub-pixel 14 in the first pixel unit and the center of the second sub-pixel 14 in the second pixel unit adjacent to the first pixel unit. In other words, the center of the third sub-pixel 16*a* or the center of the fourth sub-pixel 16*b* in one pixel unit is located at an outer side of an extension line of a connecting line between the center of the second sub-pixel 14 in the pixel unit and the center of the second sub-pixel 14 in the other pixel unit adjacent thereto. For example, specific to some embodiments, as shown in FIG. 7 and FIG. 8, an extension line of a connecting line between the center of the second sub-pixel R1 in the first pixel unit and the center of the second sub-pixel R2 in the second pixel unit adjacent to the first pixel unit is staggered with the center of the third sub-pixel G11 and the center of the fourth sub-pixel G12 in the first pixel unit, and the center of the third sub-pixel G11 and the center of the fourth sub-pixel G12 are located on two sides of the extension line of the connecting line. It is to be noted that the center of the sub-pixel being located at an outer side of the connecting line of centers means that the center of the sub-pixel is staggered with the connecting line of centers. For example, the center of the sub-pixel is located at one side of the connecting line of centers.

In a same pixel unit, along the first direction and the second direction, a minimum distance between two adjacent sub-pixels is n, and along the first direction and the second direction, a minimum distance between the nearest sub-pixels in different colors in two adjacent pixel units is also n, where 10 μm<n<30 μm. In this way, on the one hand, the sub-pixels are arranged more uniformly, which is conducive to improving the quality of display; on the other hand, the sense of serration produced by light-emitting cross color or interference between adjacent sub-pixels can be effectively prevented. It is to be noted that the display panel according to the embodiment of the present application may be an organic light-emitting display panel, the sub-pixel includes at least an anode, a cathode, and a light-emitting layer between the anode and the cathode, and the driving circuit applies a voltage between the anode and the cathode to excite the migration of carriers and act on the light-emitting layer, so as to emit light. The display panel may further include a PDL. The PDL defines a plurality of pixel openings. The light-emitting layer of the sub-pixel is arranged in the pixel openings to prevent cross color or interference between adjacent sub-pixels. Therefore, an area of the pixel opening is a light-emitting area of the sub-pixel. However, due to the limitations of the vapor deposition technology, in order to ensure that the light-emitting material is completely vapor-deposited into the pixel opening, an opening area of the mask is generally larger than that of the pixel opening, so as to leave a vapor deposition margin. For example, as shown in FIG. 7, an inner side edge of the sub-pixel is called a pixel edge, which is a boundary of the pixel opening of the PDL. An outer side edge is called a virtual edge of the sub-pixel. The virtual edge is a boundary of a vapor deposition opening of the mask. Thus, in the embodiment of the present application, the pitch between the sub-pixels refers to a distance between pixel edges of two sub-pixels. Specific to the embodiments shown in FIG. 3 and FIG. 7, if two adjacent sub-pixels have two pixel edges adjacent and parallel to each other, a minimum distance between the two adjacent sub-pixels is a vertical distance between the two pixel edges adjacent and parallel to each other.

Further, a minimum distance between a second sub-pixel R1 in the first pixel unit and a third sub-pixel G21 in the second pixel unit adjacently arranged in the second direction is p, where n<p<3n. Alternatively, a minimum distance between a second sub-pixel R2 in the second pixel unit and a third sub-pixel G11 in the first pixel unit adjacently arranged in the first direction is q, where n<q<3n. In this way, the light-transmitting reserved region can be ensured to have an enough size to meet the amount of light input required for the normal operation of the under-screen photosensitive device.

Connecting lines between centers of four adjacent third sub-pixels and fourth sub-pixels form a virtual quadrilateral. The virtual quadrilateral has a minimum inner angle γ greater than 60° and less than 90° In this way, on the one hand, distance between the four adjacent third sub-pixels and fourth sub-pixels are limited by controlling the minimum angle, so as to prevent uneven display caused by an excessively large distance. On the other hand, the green sub-pixels in the adjacent pixel groups are not too close, so as to further prevent visual integration of the two adjacent green sub-pixels by the human eyes caused by difficult distinction between two adjacent green sub-pixels due to a short distance between the adjacent green sub-pixels.

A connecting line between the centers of the third sub-pixels in a same row and/or column is a non-straight line or an approximate straight line, and/or a connecting line between the centers of the fourth sub-pixels in a same row and/or column is a non-straight line or an approximate straight line. For example, as shown in FIG. 6, a connecting line between the centers of the green sub-pixels in a same row and/or column is zigzag. In this way, on the one hand, the protrusion degrees of the sub-pixels are weakened, and the color edge phenomenon is ameliorated; on the other hand, the green sub-pixels in the adjacent pixel groups are not too close, so as to further prevent visual integration of two adjacent green sub-pixels by the human eyes caused by difficult distinction between two adjacent green sub-pixels due to a short distance between the adjacent green sub-pixels.

In a first direction and a second direction, centers of red sub-pixels are not in a same straight line; or in a first direction and a second direction, centers of green sub-pixels are not in a same straight line; or in a first direction and a second direction, centers of blue sub-pixels are not in a same straight line. In this way, the dislocation between the sub-pixels is ensured, which effectively ameliorates the color edge phenomenon.

It may be understood that, in some embodiments, a connecting line between the centers of the first sub-pixels in a same row and/or column may be a straight line, and a connecting line between the centers of the second sub-pixels in a same row and/or column may be a straight line, which is not limited herein.

Connecting lines between centers of two green sub-pixels in any pixel group of odd-numbered rows or columns and two nearest green sub-pixels in a pixel group of even-numbered rows or columns adjacent thereto form a fifth virtual quadrilateral. A minimum inner angle in the fifth virtual quadrilateral is γ≥60°. In this way, visual integration of the adjacent green sub-pixels by the human eyes caused by difficult distinction between two adjacent green sub-pixels due to a short distance between the adjacent green sub-pixels is further prevented.

A display panel is further provided in the third aspect of the present application, including the pixel arrangement structure in the above embodiment.

Based on the same application concept, the present application further provides a mask configured to manufacture the pixel arrangement structure according to the embodiment of the present application. The mask includes a plurality of opening regions. The opening regions correspond to shapes and positions of the first sub-pixel 12, the second sub-pixel 14, the third sub-pixel 16*a* and the fourth sub-pixel 16*b*.

Based on the same application concept, the present application further provides a display device. The display device includes a display panel 100 in the embodiment in the above aspects.

Specifically, the display device may be applied to fields such as mobile phone terminals, bionic electronics, electronic skin, wearable devices, vehicle-mounted devices, Internet of Things devices and artificial intelligence devices. For example, the display device may be a digital device such as a mobile phone, a tablet computer, a handheld computer, an iPod, or a smart watch.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present application, and their description is specific and detailed, but cannot therefore be understood as a limitation on the patent scope of the application. It should be noted that those of ordinary skill in the art may further make variations and improvements without departing from the conception of the present application, and these all fall within the protection scope of the present application. Therefore, the patent protection scope of the present application should be subject to the appended claims.

What is claimed is:

1. A pixel arrangement structure, comprising a first pixel unit;

the first pixel unit comprising a first sub-pixel, a second sub-pixel, a third sub-pixel, and a fourth sub-pixel;

wherein in the first pixel unit, a center of the first sub-pixel, a center of the second sub-pixel, a center of the third sub-pixel form vertices of a first triangle; the center of the first sub-pixel, the center of the second sub-pixel, and a center of the fourth sub-pixel form vertices of a second triangle the first triangle and the second triangle do not have an overlapping area; and the center of the first sub-pixel and the center of the second sub-pixel are vertices of a common side of the first triangle and the second triangle; and wherein the second sub-pixel has a second major axis and a second minor axis, a length of the second sub-pixel along the second major axis is greater than a width of the second sub-pixel along the second minor axis, and in the first pixel unit, a center line of the second sub-pixel along the second major axis of the second sub-pixel does not pass through the center of the third sub-pixel or the center of the fourth sub-pixel, the first triangle and the second triangle are acute triangles, and distances from the center of the third sub-pixel and the center of the fourth sub-pixel to the center of the second sub-pixel respectively are not equal, the third sub-pixel and the fourth sub-pixel have a same color, and a distance between the center of the third sub-pixel and the center of the fourth sub-pixel is greater than that between the center of the first sub-pixel and the center of the second sub-pixel, and the second sub-pixel is in a shape of a rectangle or quasi-rectangle having two long edges, an extension line of one of the two long edges of the second sub-pixel passes through a gap between the first sub-pixel and the third sub-pixel, and an extension line of another long edge of the second sub-pixel overlaps with an edge of the first sub-pixel near the third sub-pixel or passes through the gap between the first sub-pixel and the third sub-pixel.

2. The pixel arrangement structure according to claim 1, wherein a projection of one of two vertices formed by the third sub-pixel or the fourth sub-pixel of the first triangle or the second triangle onto an opposite side of the vertex that is projected does not overlap with the center of the third sub-pixel or the center of the fourth sub-pixel.

3. The pixel arrangement structure according to claim 2, wherein the projection of the vertex across the common side of the first triangle and the second triangle on the opposite side of the vertex is between two intersection points of contours of two sub-pixels corresponding to the opposite side of the vertex that is projected.

4. The pixel arrangement structure according to claim 3, wherein the projection of the vertex across the common side of the first triangle and the second triangle on the opposite side of the vertex that is projected is adjacent to or at a center point of the opposite side of the vertex that is projected.

5. The pixel arrangement structure according to claim 2, wherein, in the first pixel unit, an extension line or a tangent line of a side edge of the second sub-pixel along the second major axis of the second sub-pixel does not intersect whole of the third sub-pixel or the fourth sub-pixel; and wherein a projection of the sub-pixel corresponding to the vertex of the common side of the triangle and the second triangle on the opposite side of the vertex that is projected is wholly between two intersection points of contours of two sub-pixels corresponding to the opposite side of the vertex that is projected.

6. The pixel arrangement structure according to claim 1, wherein the third sub-pixel and the fourth sub-pixel are green light-emitting sub-pixels; the first sub-pixel is a blue light-emitting sub-pixel, and the second sub-pixel is a red light-emitting sub-pixel.

7. The pixel arrangement structure according to claim 1, wherein the pixel arrangement structure further comprises a second pixel unit, the first pixel unit and the second pixel unit being alternately arranged;

wherein sub-pixel structures of the second pixel unit are the same as sub-pixel structures of the first pixel unit; or wherein the sub-pixel structures of the second pixel unit are mirror-symmetrical to the sub-pixel structures of the first pixel unit after being rotated by a predetermined angle; and wherein the predetermined angle is greater than 0° and less than 360°.

8. The pixel arrangement structure according to claim 7, wherein the predetermined angle is 90°.

9. The pixel arrangement structure according to claim 7, wherein the center of the third sub-pixel or the center of the fourth sub-pixel in the first pixel unit is located at one side of an imaginary connecting line between the center of the second sub-pixel in the first pixel unit and the center of the second sub-pixel in the second pixel unit adjacent to the first pixel unit or an extension line of the imaginary connecting line.

10. The pixel arrangement structure according to claim 1, wherein any of the first sub-pixel, the second sub-pixel, the third sub-pixel and the fourth sub-pixel is in a regular or irregular shape with a major axis and a minor axis;

wherein the first sub-pixel has a first major axis and a first minor axis; the third sub-pixel has a third major axis and a third minor axis; the fourth sub-pixel has a fourth major axis and a fourth minor axis;

wherein in the first pixel unit, the second major axis, the third major axis and the fourth major axis are parallel with each other; and wherein a length ratio of the first major axis to the first minor axis ranges from 1.5 to 1; a length ratio of the second major maxis to the second minor axis ranges from 5 to 1; a length ratio of the third major axis to the third minor axis ranges from 5 to 1; and a length ratio of the fourth major axis to the fourth minor axis ranges from 5 to 1.

11. The pixel arrangement structure according to claim 1, Wherein a ratio of the distances from the center of the third sub-pixel and the center of the fourth sub-pixel to the center of the second sub-pixel respectively is less than 3 and greater than 1.

12. The pixel arrangement structure according to claim 7, wherein the pixel arrangement structure comprises a plurality of first pixel units and a plurality of second pixel units, the plurality of first pixel units and the plurality of second pixel units are alternately arranged in a first direction and a second direction, and the first direction is perpendicular to the second direction; an angle between the first direction and a row direction is 45°; and wherein a major axis direction of each of the first sub-pixel, the second sub-pixel the third sub-pixel and the fourth sub-pixel of the first pixel unit is parallel to the first direction.

13. The pixel arrangement structure according to claim 1, wherein the first pixel unit further comprises a light-transmitting reserved region arranged adjacent to the second sub-pixel;

wherein an area of the light-transmitting reserved region is greater than a minimum light-emitting area of sub-pixels in the first pixel unit; and wherein the light-transmitting reserved region has a size ranging from 10 μm to 90 μm in the first direction, and has a size ranging from 20 μm to 90 μm in the second direction.

14. The pixel arrangement structure according to claim 12, wherein the plurality of first pixel units and a plurality of second pixel units are arranged in multiple rows, and in a row direction, an imaginary connecting line of centers of the first sub-pixels in each row is a straight line; and wherein an imaginary connecting line of centers of the second sub-pixels in each row is a straight line; and an imaginary connecting line of centers of the third sub-pixels or an imaginary connecting line of centers the fourth sub-pixels in each row is a non-straight line or a substantially straight line.

15. The pixel arrangement structure according to claim 1, wherein the third sub-pixel and the fourth sub-pixel are green light-emitting sub-pixels, the first sub-pixel is a blue light-emitting sub-pixel, and the second sub-pixel is a red light-emitting sub-pixel, wherein in a first direction and a second direction, centers of red light-emitting sub-pixels are not in a same straight line; or wherein in a first direction and a second direction, centers of green light-emitting sub-pixels are not in a same straight line; or wherein in a first direction and a second direction, centers of blue light-emitting sub-pixels are not in a same straight line.

16. A display panel, comprising the pixel arrangement structure according to claim 1.

17. The pixel arrangement structure according to claim 1, wherein a length of an imaginary connecting line between the center of the second sub-pixel and the center of the third sub-pixel in the first pixel unit is not equal to that of an imaginary connecting line between the center of the second sub-pixel and the center of the fourth sub-pixel in the first pixel unit;

a length of an imaginary connecting line between the center of the first sub-pixel and the center of the second sub-pixel in the first pixel unit is not equal to that of an imaginary connecting line between the center of the third sub-pixel and the center of the fourth sub-pixel in the first pixel unit; and a length of an imaginary connecting line between the center of the first sub-pixel and the center of the third sub-pixel in the first pixel unit is not equal to that of an imaginary connecting line between the center of the first sub-pixel and the center of the fourth sub-pixel in the first pixel unit.

18. The pixel arrangement structure according to claim 7, wherein a major-axis direction of the second sub-pixel in the first pixel unit is different from a major-axis direction of the second sub-pixel in the second pixel unit.

* * * * *